(12) United States Patent
Wang et al.

(10) Patent No.: US 11,851,782 B2
(45) Date of Patent: *Dec. 26, 2023

(54) OPEN CZOCHRALSKI FURNACE FOR SINGLE CRYSTAL GROWTH

(71) Applicant: MEISHAN BOYA ADVANCED MATERIALS CO., LTD., Sichuan (CN)

(72) Inventors: Yu Wang, Meishan (CN); Weiming Guan, Meishan (CN); Zhenxing Liang, Meishan (CN)

(73) Assignee: MEISHAN BOYA ADVANCED MATERIALS CO., LTD., Meishan (CN)

( * ) Notice: Subject to any disclaimer, the term of this patent is extended or adjusted under 35 U.S.C. 154(b) by 0 days.

This patent is subject to a terminal disclaimer.

(21) Appl. No.: 18/062,595

(22) Filed: Dec. 7, 2022

(65) Prior Publication Data

US 2023/0099530 A1 Mar. 30, 2023

Related U.S. Application Data

(63) Continuation of application No. 17/451,844, filed on Oct. 22, 2021, now Pat. No. 11,572,634, which is a continuation of application No. 17/035,741, filed on Sep. 29, 2020, now Pat. No. 11,155,930, which is a continuation of application No. 16/903,326, filed on Jun. 16, 2020, now Pat. No. 10,844,514, which is a
(Continued)

(51) Int. Cl.
*C30B 15/14* (2006.01)
*C30B 15/30* (2006.01)

(52) U.S. Cl.
CPC .............. *C30B 15/14* (2013.01); *C30B 15/30* (2013.01)

(58) Field of Classification Search
CPC ... C30B 15/14; C30B 15/20; Y10T 117/1064; Y10T 117/106; Y10T 117/1072
See application file for complete search history.

(56) References Cited

U.S. PATENT DOCUMENTS

| 5,958,133 | A | 9/1999 | Boulaev |
| 10,844,514 | B1 * | 11/2020 | Wang et al. |
| 10,982,349 | B2 * | 4/2021 | Wang et al. |

(Continued)

FOREIGN PATENT DOCUMENTS

| CN | 1414146 A | 4/2003 |
| CN | 2571773 Y | 9/2003 |

(Continued)

OTHER PUBLICATIONS

The Second Office Action in Chinese Application No. 201980051052.2 dated Jul. 13, 2021, 15 pages.
(Continued)

*Primary Examiner* — Robert M Kunemund
(74) *Attorney, Agent, or Firm* — METIS IP LLC

(57) ABSTRACT

The present disclosure provides a temperature field device for crystal growth. The temperature field device may include a first drum; a second drum located inside the first drum; a bottom plate mounted on a bottom of the temperature field device and covering a bottom end of the first drum; and a first cover plate mounted on a top of the temperature filed device and covering a top end of the first drum.

18 Claims, 14 Drawing Sheets

Related U.S. Application Data continuation of application No. PCT/CN2019/101698, filed on Aug. 21, 2019.

(56) References Cited

U.S. PATENT DOCUMENTS

| | | | |
|---|---|---|---|
| 11,441,233 B2* | 9/2022 | Wang et al. | |
| 11,572,634 B2* | 2/2023 | Wang et al. | |
| 2005/0066888 A1 | 3/2005 | Griggs et al. | |
| 2006/0005761 A1 | 1/2006 | Kulkarni et al. | |
| 2007/0017435 A1 | 1/2007 | Takanashi | |
| 2010/0064965 A1 | 3/2010 | Muehe et al. | |
| 2013/0224100 A1 | 8/2013 | Von Dollen | |

FOREIGN PATENT DOCUMENTS

| | | | |
|---|---|---|---|
| CN | 101736395 A | 6/2010 | |
| CN | 201506845 U | 6/2010 | |
| CN | 102758249 A | 10/2012 | |
| CN | 103074685 A | 5/2013 | |
| CN | 103374753 A | 10/2013 | |
| CN | 203403172 U | 1/2014 | |
| CN | 103806101 A | 5/2014 | |
| CN | 104451858 A | 3/2015 | |
| CN | 204325548 U | 5/2015 | |
| CN | 105177711 A | 12/2015 | |
| CN | 205874579 U | 1/2017 | |
| CN | 205893452 U | 1/2017 | |
| CN | 106435712 A | 2/2017 | |
| CN | 206188917 U | 5/2017 | |
| CN | 107299388 A | 10/2017 | |
| CN | 108330533 A | 7/2018 | |
| CN | 108486647 A | 9/2018 | |
| JP | S61146787 A | 7/1986 | |
| JP | H09278584 A | 10/1997 | |
| RU | 1466275 A1 | 12/1996 | |

OTHER PUBLICATIONS

Pan, Hongna et al., Preparation of Single Crystal Silicon, Preparation of Technical Wood from Crystalline Silicon Solar Cells, 2017, 58 pages.

Compilation team of "Questions and Answers on Calcium Carbide Production" in Calcium Carbide Factory of Jilin Chemical Industry Company, What is an Open Furnace? Questions and Answers on Calcium Carbide Production, 1976, 8 pages.

First Office Action in Chinese Application No. 202110870910.5 dated Jan. 24, 2022, 21 pages.

* cited by examiner

A-A

OPEN CZOCHRALSKI FURNACE FOR SINGLE CRYSTAL GROWTH

CROSS-REFERENCE TO RELATED APPLICATIONS

This application is a Continuation of U.S. application Ser. No. 17/451,844 filed on Oct. 22, 2021, which is a Continuation of U.S. application Ser. No. 17/035,741 (U.S. Pat. No. 11,155,930) filed on Sep. 29, 2020, which is a Continuation of U.S. application Ser. No. 16/903,326 (U.S. Pat. No. 10,844,514) filed on Jun. 16, 2020, which is a Continuation of International Application No. PCT/CN2019/101698 filed on Aug. 21, 2019, the entire contents of which are hereby incorporated by reference.

TECHNICAL FIELD

The present disclosure generally relates to the technical field of the growth of high-temperature oxide single crystal material, and in particular, to an apparatus for crystal growth.

BACKGROUND

The single crystal furnace is a special apparatus for preparing artificial crystals such as silicon, germanium, gallium arsenide, YAG (yttrium aluminum garnet), LSO (lutetium oxyorthosilicate), which is a comprehensive system integrating mechanic, electric, computer, aerodynamic, fluid power, thermodynamics, or other disciplines. Currently, the high-temperature crystal growth apparatus using the Czochralski technique mainly works in a closed environment (vacuum furnace) with a relatively high vacuum and pressure. However, since the structure of the vacuum furnace is complex and the vacuum environment is difficult to control, improper operations may cause the furnace body exploded, thereby causing great safety hazards to production. Therefore, the present disclosure provides an open crystal growth apparatus.

SUMMARY

One embodiment of the present disclosure provides an apparatus for crystal growth. The apparatus may include a furnace chamber. The furnace chamber may include a furnace body and a furnace cover. The furnace cover may be mounted on a top of the furnace body. The furnace cover may include a first through hole. The first through hole may be configured to place a temperature field device.

In some embodiments, a cooling structure may be mounted on a sidewall of the furnace body and the furnace cover.

In some embodiments, the cooling structure mounted on the furnace cover may include at least one circle of square copper tube. A cooling medium may pass through the square copper tube.

In some embodiments, the temperature field device may include a sealing drum, a cover plate mounted on a top of the sealing drum, and a bottom plate mounted on a bottom of the sealing drum. The cover plate may include a second through hole. The apparatus may further include a furnace frame. The furnace chamber may be mounted on the furnace frame. The apparatus may further include a pulling rod component that passes through the second through hole and extends into the temperature field device. The apparatus may further include a heater mounted between the furnace chamber and the temperature field device.

In some embodiments, the apparatus may further include a pulling component configured to drive the pulling rod component to move up and down and a rotating component configured to drive the pulling rod component to rotate.

In some embodiments, the pulling component may include a pillar, a slide, a screw rod, and a first driving device. The first driving device may be mounted on a top of the pillar. A slide rail may be mounted on the pillar. The screw rod may be mounted in parallel with the slide rail, and one end of the screw rod may be connected to the first driving device. The slide may be nested on the screw rod and fit with the screw rod by threads and at least a part of the slide may be located within a slide chute, and the rotation of the screw rod may drive the slide to move up and down along the slide chute. The rotating component may be mounted on the slide.

In some embodiments, the apparatus may further include a weighing component configured to determine a weight of a crystal on the pulling rod component. The weighing component may be mounted on the slide.

In some embodiments, the rotating component may at least include a second driving device and a transmission component. The second driving device may drive the weighing component to rotate through the transmission component.

In some embodiments, the weighing component may include a weighing chamber and a weighing sensor. The weighing sensor may be mounted inside the weighing chamber. One end of the weighing sensor may be fixedly connected to the pulling rod component. The other end of the weighing sensor may be fixedly connected to a cover plate of the weighing chamber.

In some embodiments, the transmission component may include a belt pulley and a belt. An output spin axis of the second driving device may be connected to a spin axis of the belt pulley. At least one belt pulley may be mounted on the belt and the weighing chamber.

In some embodiments, the pulling rod component may at least include a middle rod and a guide rod. One end of the middle rod may be fixedly connected to the weighing chamber. The middle rod may pass through a third through hole mounted on the slide. The middle rod may include a hollow structure. The guide rod may pass through the middle rod. One end of the guide rod may be connected to the weighing sensor, and the other end of the guide rod may be configured to connect a seed rod.

In some embodiments, the temperature field device may include a bottom plate, a cover plate, a drum, and a filler. The bottom plate may be mounted on a bottom of the temperature field device and cover an open end of the drum. The cover plate may be mounted on a top of the temperature field device and cover the other open end of the drum. The filler may be filled in the drum.

In some embodiments, the temperature field device may include a bottom plate, a first cover plate, a second cover plate, a first drum, a second drum, and a filler. The bottom plate may be mounted on a bottom of the temperature field device and cover an open end of the first barre. The first cover plate may be mounted on a top of the temperature field device and cover the other open end of the first drum. The second drum may be mounted inside the first drum. The filler may be filled in the second drum and/or a space between the second drum and the first barre. The first cover plate and the second cover plate may include through holes. In some embodiments, the filler may include a granule shaped material, a brick shaped material, and/or a felt shaped material, and the filler may be made of a heat resistant material.

In some embodiments, the filler may include at least one of a zircon sand, a zirconia particle, an alumina particle, a zirconia felt, a zirconia brick, and/or an alumina brick.

In some embodiments, the first drum may include a quartz tube, a corundum tube. The first drum may be made of a heat resistant material.

BRIEF DESCRIPTION OF THE DRAWINGS

The present disclosure is further illustrated in terms of exemplary embodiments. These exemplary embodiments are described in detail with reference to the drawings. These embodiments are non-limiting exemplary embodiments, in which like reference numerals represent similar structures, and wherein.

DETAILED DESCRIPTION

Figure 1:
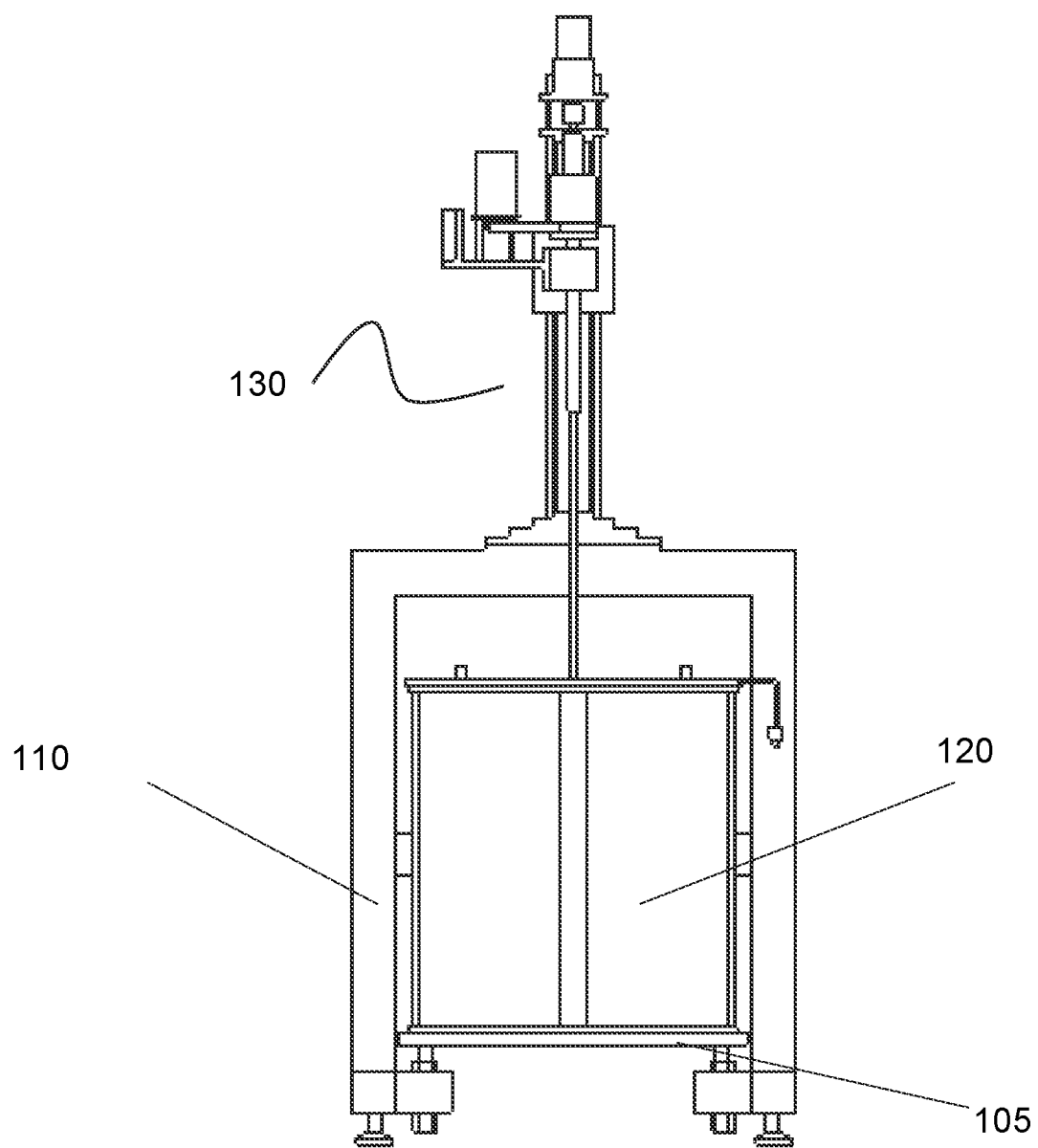
FIG. 1 is a schematic diagram illustrating a front view of an exemplary crystal growth apparatus according to some embodiments of the present disclosure.
Figure 2:
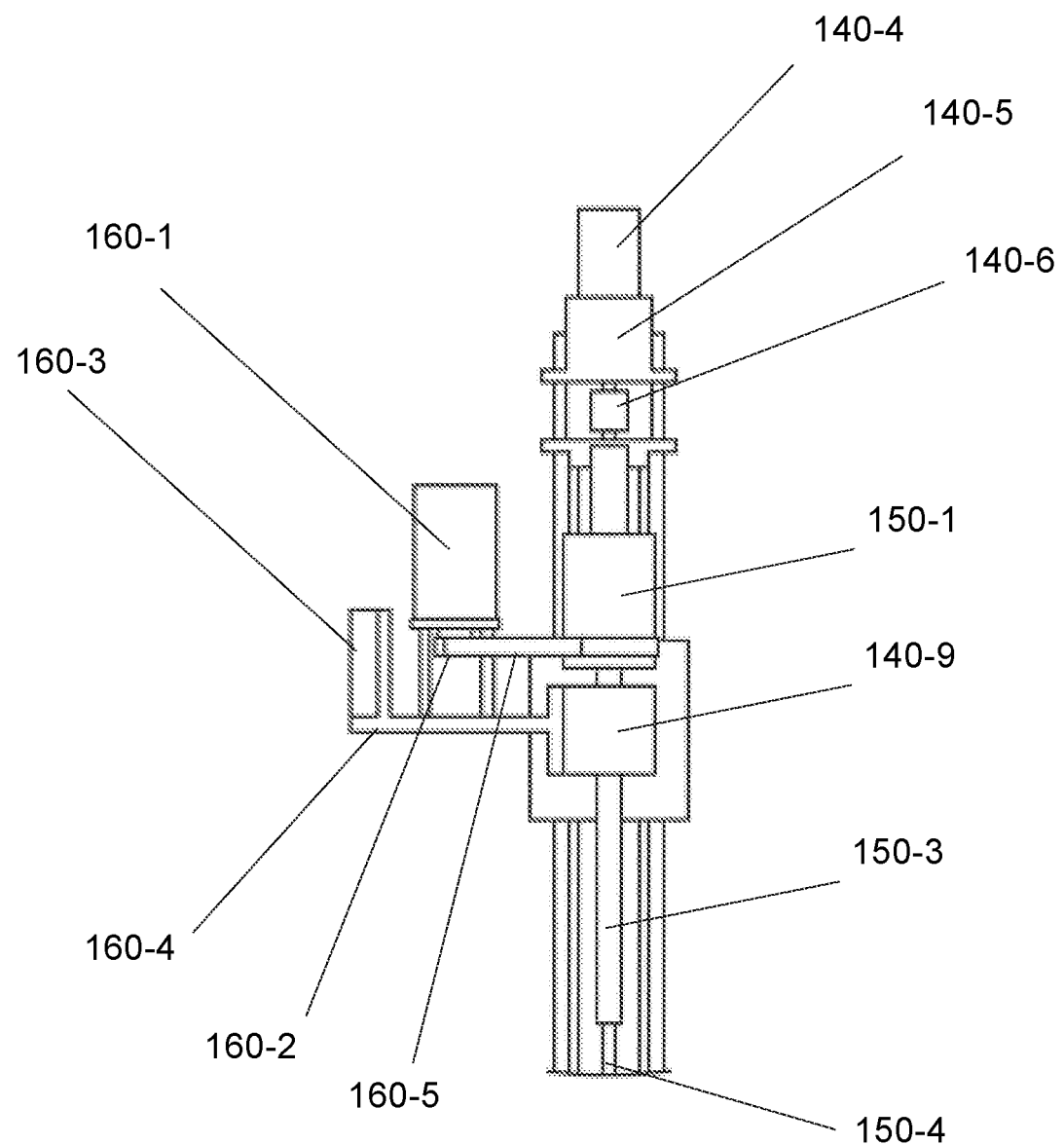
FIG. 2 is a schematic diagram illustrating an enlarged front view of an exemplary motion device according to some embodiments of the present disclosure.

In order to illustrate the technical solutions related to the embodiments of the present disclosure, a brief introduction of the drawings referred to the description of the embodiments is provided below. Obviously, drawings described below are only some examples or embodiments of the present disclosure. Those having ordinary skills in the art, without further creative efforts, may apply the present disclosure to other similar scenarios according to these drawings. Unless apparent from the locale or otherwise stated, like reference numerals represent similar structures or operations in the drawings.

It will be understood that the terms "system," "device," "unit," and/or "module" used herein are one method to distinguish different components, elements, parts, sections or assemblies of different levels. However, if other words may achieve the same purpose, the words may be replaced by other expressions.

As used in the disclosure and the appended claims, the singular forms "a," "an," and "the" include plural referents unless the content clearly dictates otherwise. In general, the terms "comprise," "comprises," and/or "comprising," "include," "includes," and/or "including," merely prompt to include steps and elements that have been clearly identified, and these steps and elements do not constitute an exclusive listing. The methods or devices may also include other steps or elements.

The present disclosure relates to an apparatus for crystal growth that can be used to prepare single crystal materials. The single crystal materials can be used in various fields such as medical device imaging, safety inspection, industrial nondestructive testing, laser, etc. The crystal growth apparatus may be used to prepare scintillation crystals, laser crystals, or any other types of crystals which can be grown according to the Czochralski technique.

Figure 3:
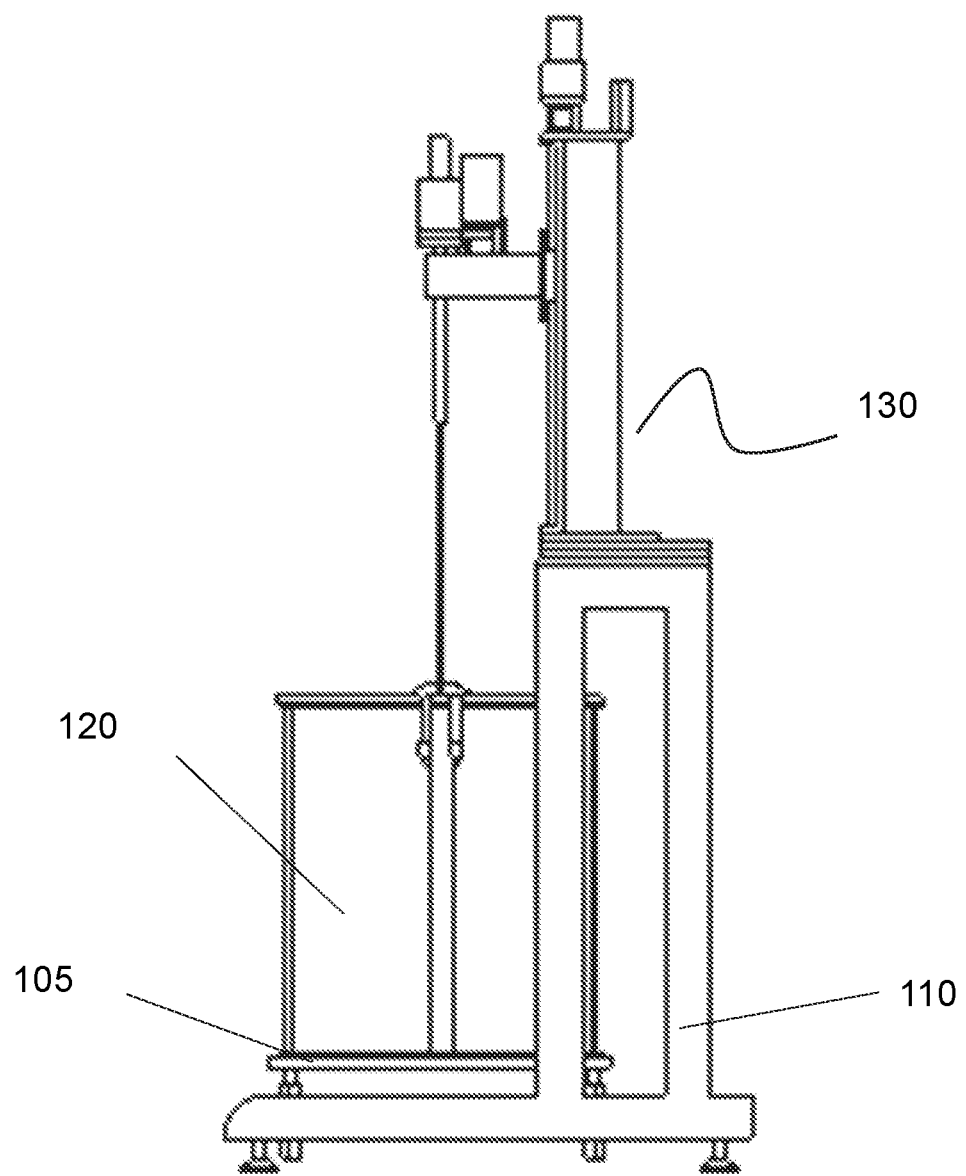
FIG. 3 is a schematic diagram illustrating a right view of an exemplary crystal growth apparatus according to some embodiments of the present disclosure.
Figure 4:
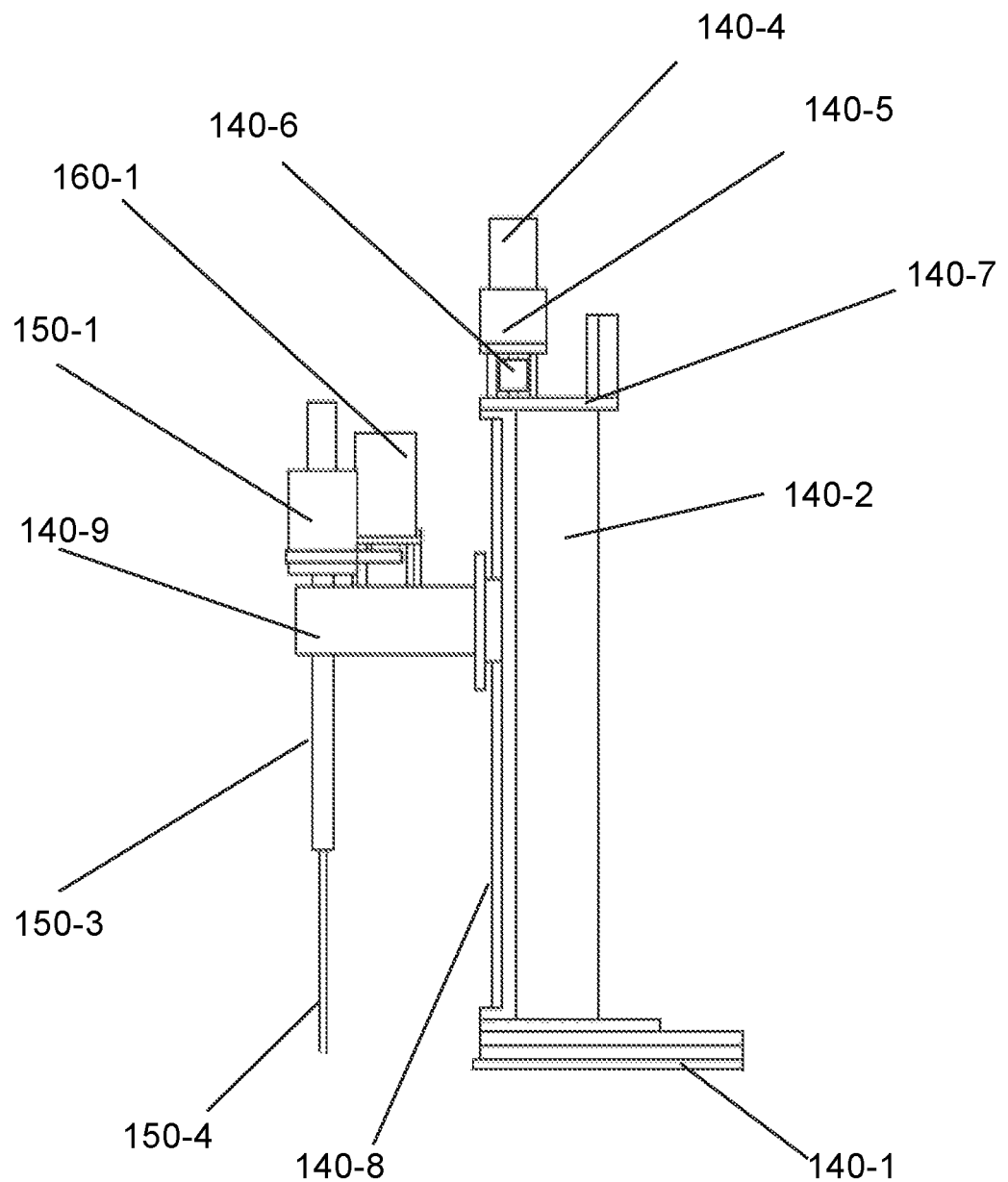
FIG. 4 is a schematic diagram illustrating an enlarged right view of an exemplary motion device according to some embodiments of the present disclosure.

As shown in FIG. 1 and FIG. 3, in some embodiments, the crystal growth apparatus may include a furnace frame 110, a furnace chamber 120, a first bottom plate 105, and a motion device 130.

The furnace frame 110 may be configured to mount different components (e.g., the furnace chamber 120, the first bottom plate 105, the motion device 130) of the crystal growth apparatus 100. For example, the furnace chamber 120 may be mounted on the furnace frame 110. For example, the furnace chamber 120 may be fixed on the furnace frame 110 by a bolt connection, a welding connection, a hinged connection, etc. In some embodiments, a size of the furnace frame 110 may be 1000 mm~1400 mm in length, 750 mm~1000 mm in width, and 1100 mm~1800 mm in height.

Figure 5:
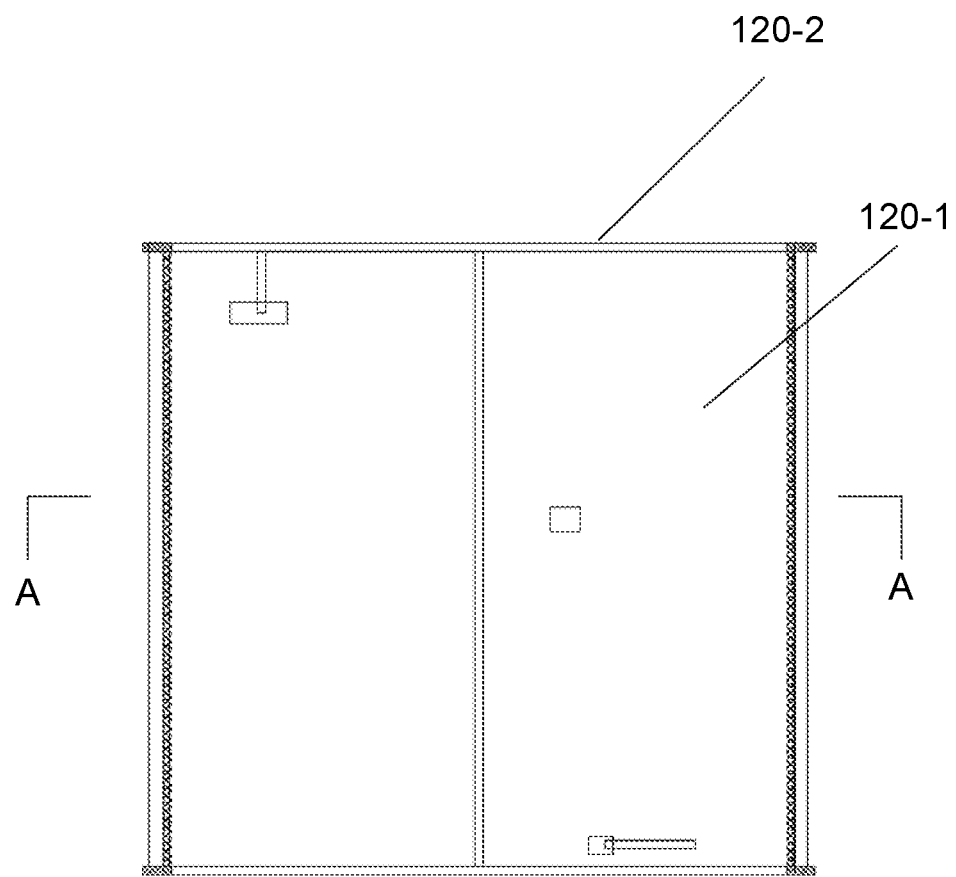
FIG. 5 is a schematic diagram illustrating an exemplary furnace body according to some embodiments of the present disclosure.
Figure 6:
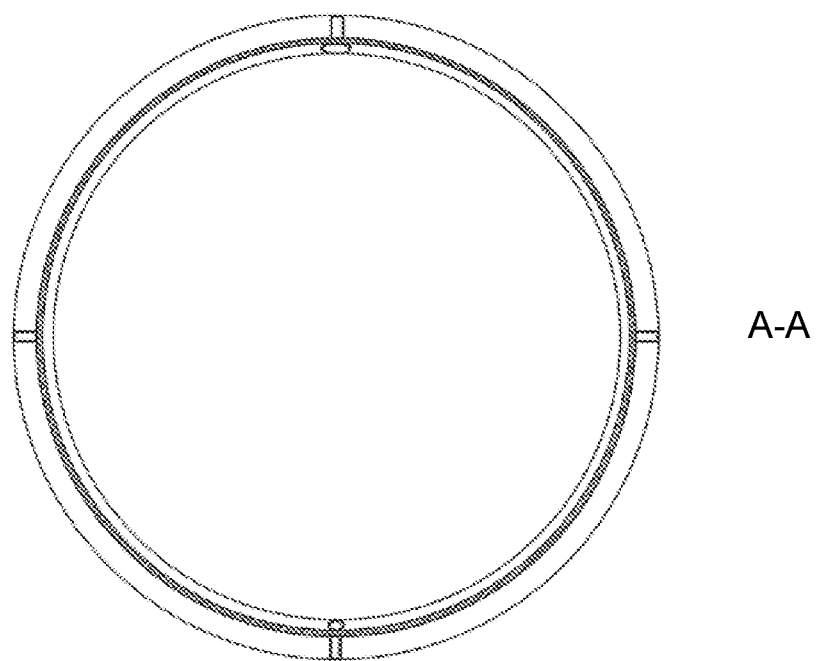
FIG. 6 is a schematic diagram illustrating a cross-sectional view of an exemplary furnace body according to some embodiments of the present disclosure.

The furnace chamber 120 may include components such as a furnace body 120-1, a furnace cover 120-2, etc. As shown in FIG. 5 and FIG. 6, a shape of the furnace chamber 120 may include a cylinder, which provides a space for crystal growth. In some embodiments, the shape of the furnace chamber 120 may include a cube. The furnace cover 120-2 may be mounted above the furnace body 120-1.

In some embodiments, the size of the furnace chamber 120 may be 500 mm~900 mm in diameter and 600 mm~1200 mm in height. In some embodiments, the furnace chamber 120 may include a cooling structure. The cooling structure may include an air-cooling structure, a liquid-cooling structure, and other structure that can play a cooling role. For example, the cooling structure may include a copper tube. Specifically, at least one circle of copper tube that is capable of passing a cooling medium (e.g., cooling gas, cooling water, or cooling oil) through may be mounted on a sidewall of the furnace body 120-1. In some embodiments, a diameter of the copper tube may be 8 mm~20 mm. Alternatively, the cooling structure may include other metal tubes (e.g., a stainless-steel tube).

Figure 7:
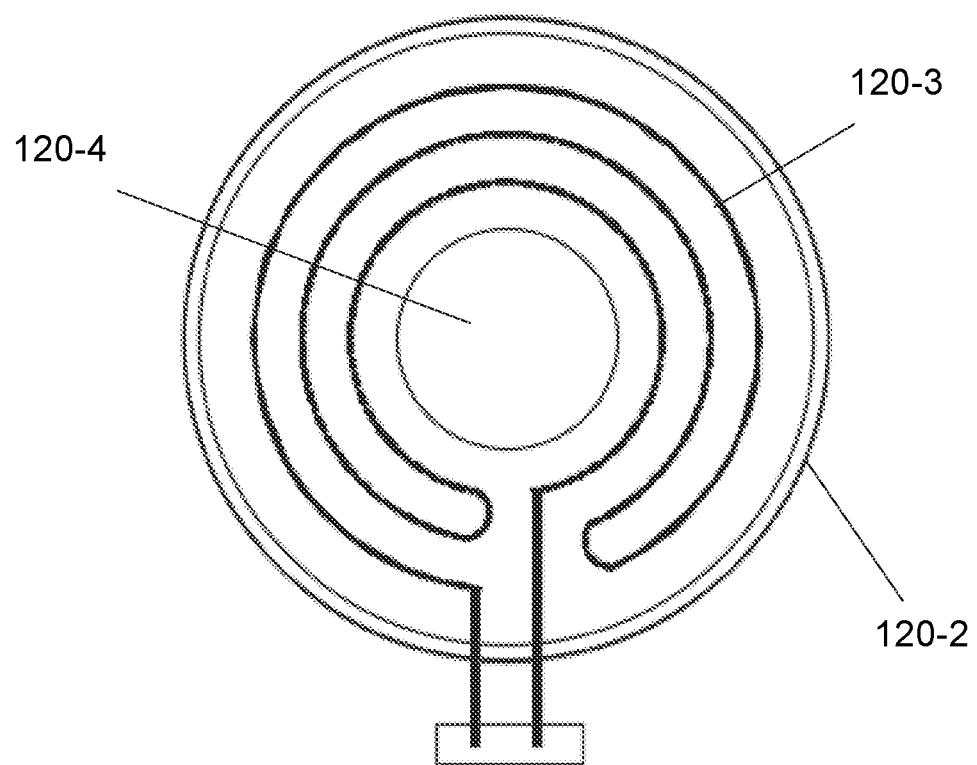
FIG. 7 is a schematic diagram illustrating an exemplary furnace cover according to some embodiments of the present disclosure.

The crystal growth apparatus 100 may further include a temperature field device 200, a pulling rod component, a heater, etc. The heater may be used to heat crystalline reactants to melt the reactants. In some embodiments, the heater may include an induction coil. The crystal growth apparatus 100 may further include an intermediate frequency power supply, which is used to provide power to the induction coil, causing the induction coil to generate an alternating electromagnetic field. A rated power of the intermediate frequency power supply may be 30 KW~60 KW. As shown in FIG. 7, the furnace cover 120-2 may include a first through hole 120-4. The first through hole 120-4 may be configured to place the temperature field device 200. In some embodiments, a height of the temperature field device 200 may be greater than a height of the furnace cover 120-2, that is, a part of the temperature field device 200 may be inside the furnace chamber 120 and other parts of the temperature field device 200 may be outside the furnace chamber 120. In some embodiments, the height of the temperature field device 200 may not be greater than the height of the furnace cover 120-2. For example, an upper-end surface of the temperature field device 200 may be flush with the furnace cover 120-2 or lower than the furnace cover 120-2. That is, the temperature field device 200 may be mounted inside the furnace chamber 120. The temperature field device 200 may include a sealing drum, a cover plate mounted on a top of the sealing drum, and a bottom plate mounted on a bottom of the sealing drum. The cover plate may include a second through hole. The pulling rod component may pass through the second through hole and extend into the temperature field device 200. The cover plate may also include a through hole for passing a gas through. Description regarding the structure of the temperature field device 200 can be found elsewhere in the present disclosure (e.g., FIGS. 11-14 and the descriptions thereof). In some embodiments, the induction coil may be mounted inside the furnace chamber 120 and the temperature field device 200 may be mounted inside the induction coil, that is, a multi-turn induction coil may be set around the temperature field device 200. Descriptions regarding a structure of the pulling rod component can be found elsewhere in the present disclosure.

In some embodiments, as shown in FIG. 7, at least one circle of square copper tube 120-3 capable of passing a cooling medium through may be mounted above the furnace cover 120-2. Specifically, at least one circle of copper tube 120-3 (e.g., three circles of copper tube) with a size of 20 mm in width, 10 mm in height, and 2 mm in thickness may be evenly and deeply buried and tiled in an upper-end surface of the furnace cover 120-2. For example, circulating cooling water under 10° C.~40° C. may pass through the square copper tube to play a role of heat insulation and heat dissipation. In some embodiments, a cross-sectional shape of the copper tube may be not limited to a square and may include other shapes such as a circle. Alternatively, the copper tube 120-3 may also be replaced with other metal tube (e.g., a stainless-steel tube).

In some embodiments, the furnace chamber 120 may be designed as a non-closed structure. That is, after the temperature field device 200 is placed in the first through hole 120-4 of the furnace cover 120-2, there may be no sealing between the furnace cover and an outer wall of the temperature filed device 200. This design may be conducive to saving manufacture and maintenance costs, thereby reducing production costs.

The first bottom plate 105 may be configured to support components such as the furnace chamber 120, the temperature field, the heater, etc. In some embodiments, the first bottom plate 105 may be a part of the furnace body 120-1. That is, the furnace body 120-1 may include components such as a sidewall, the first bottom plate 105, etc.

In some embodiments, the motion device 130 may include a pulling component 140, a weighing component 150, and a rotating component 160. Description regarding the pulling component 140 and the weighing component 150 may be found elsewhere in the present disclosure (e.g., FIGS. 8-10 and the descriptions thereof). Description regarding the rotating component 160 may be found elsewhere in the present disclosure (e.g., FIGS. 10-12 and the descriptions thereof).

Figure 8:
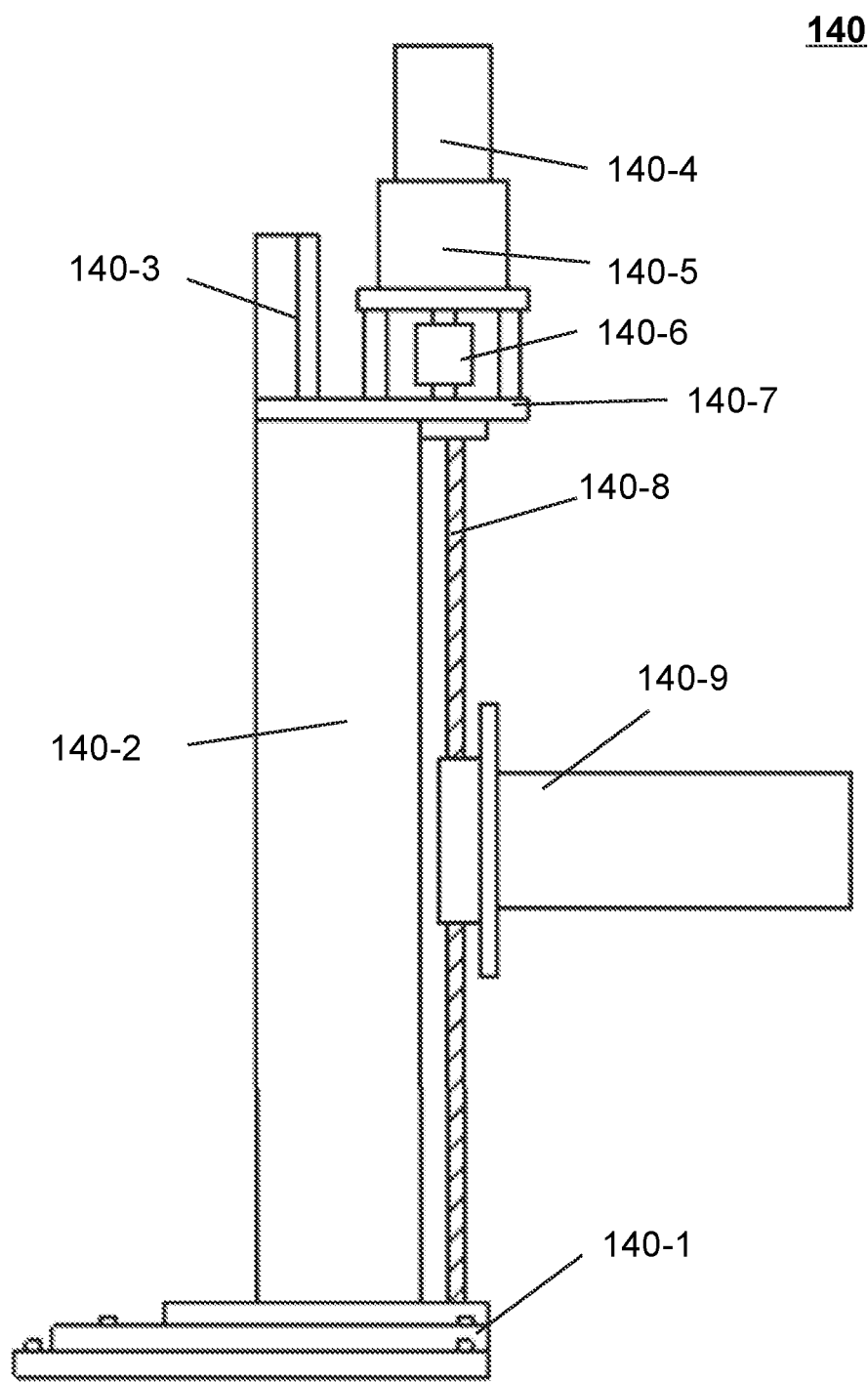
FIG. 8 is a schematic diagram illustrating an exemplary pulling component according to some embodiments of the present disclosure.
Figure 9:
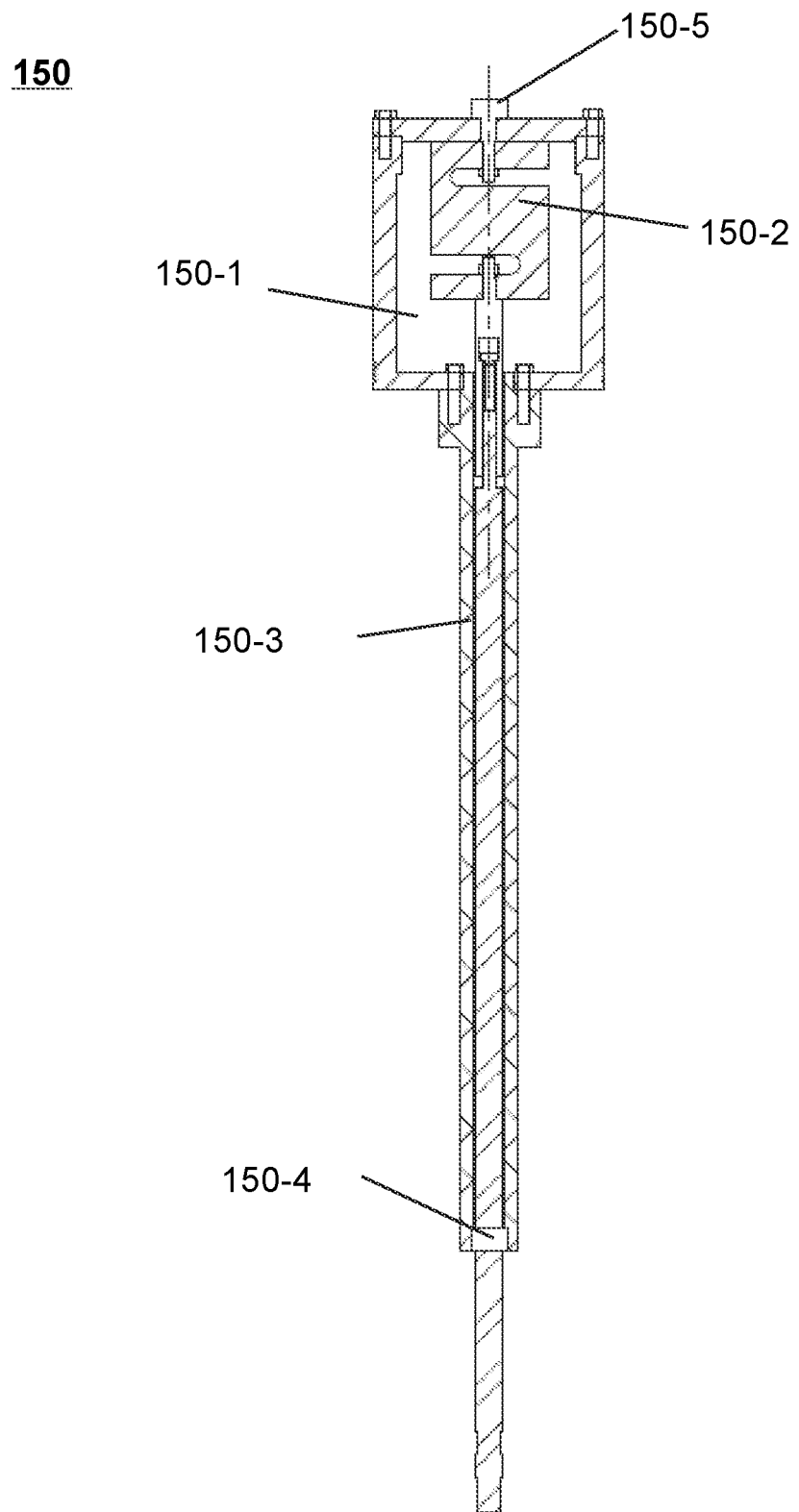
FIG. 9 is a schematic diagram illustrating an exemplary weighing component according to some embodiments of the present disclosure.
Figure 10:
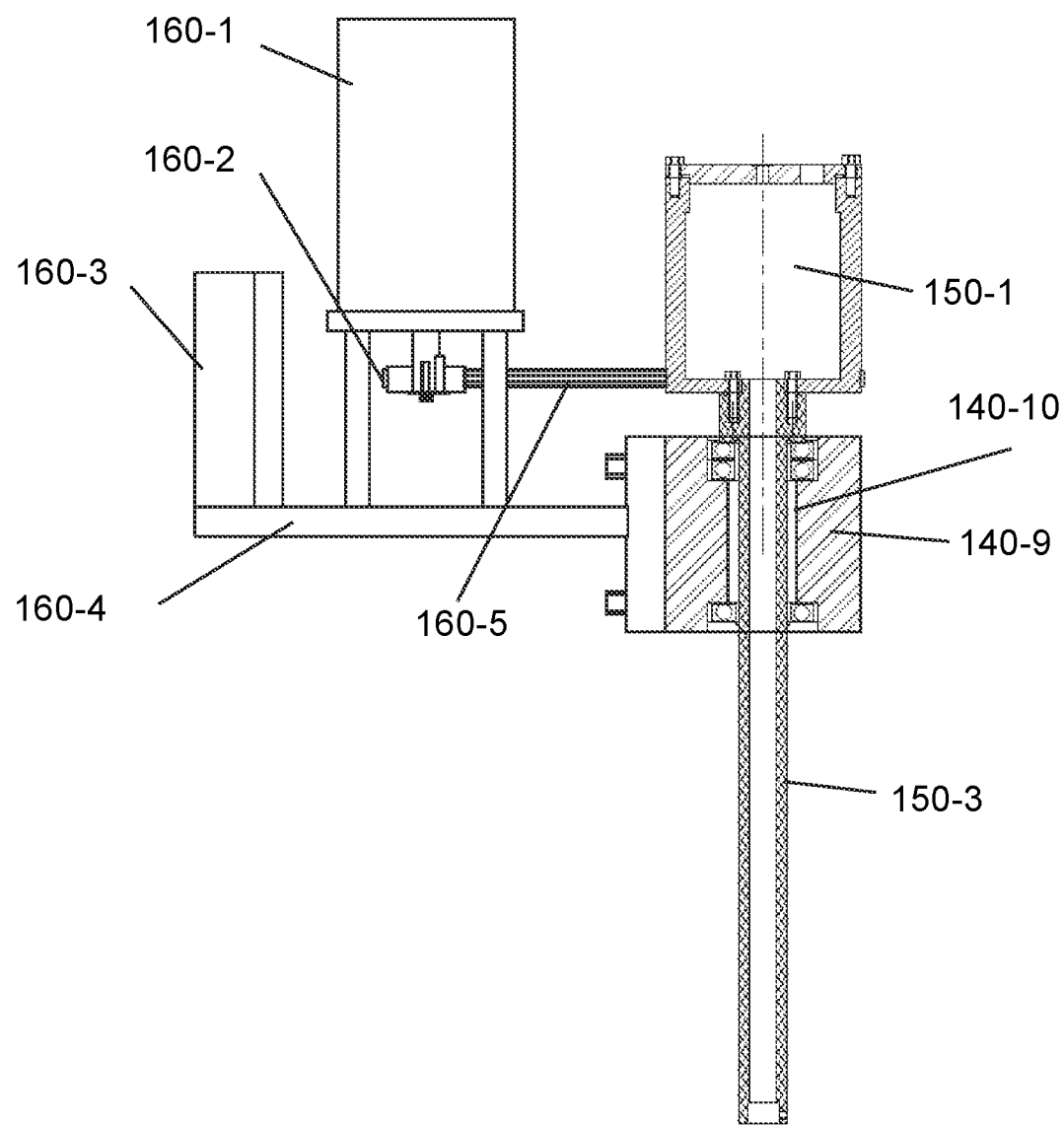
FIG. 10 is a schematic diagram illustrating an exemplary rotating component according to some embodiments of the present disclosure.

The structures of the pulling component 140, the weighing component 150, and the rotating component 160 may be described below in connection with FIGS. 8-10.

The pulling component 140 may be fixed on the furnace frame. The pulling component 140 may be configured to control a pulling rod to move up and down.

The pulling component 140 may include a mounting base 140-1, a pillar 140-2, a first driving device, a coupling 140-6, a mounting bracket 140-7, a screw rod 140-8, and a slide 140-9. The mounting base 140-1 may include one or more mounting adjustment plates. By adjusting a count of the mounting adjustment plate(s), a height of the mounting base 140-1 may be adjusted. By adjusting the mounting adjustment plate(s) to move back and forth or left and right, a concentricity between the guide rod and the temperature field device 200 may be adjusted.

In some embodiments, a first driver 140-3, a first motor 140-4, and a transmission 140-5 may be combined into the first driving device. The first driving device may be mounted on a top of the pillar 140-2. The first driver 140-3 may receive a control command from a control system and control the first motor 140-4 (e.g., controlling a rotation speed, a torque of the first motor 140-4). In some embodiments, the first motor 140-4 may include a stepping hybrid servo motor. In some embodiments, the transmission 140-5 may be configured to control a rotation speed of an output shaft of the transmission 140-5. In some embodiments, the transmission 140-5 may include a precision planetary gear reducer. The mounting bracket 140-7 may be configured to support the first driver 140-3, the first motor 140-4, and the transmission 140-5. The first driver 140-3 may drive the first motor 140-4 to rotate based on the control command. The transmission 140-5 may convert a rotation speed of the first motor 140-4 from a relatively high rotation speed to a relatively low rotation speed through an internal gear structure, and output a reduced rotation speed through an output shaft of the transmission 140-5.

The pillar 140-2 may include a slide rail. The screw rod 140-8 may be mounted in parallel with the slide rail. One end of the screw rod 140-8 may be connected to the first driving device. Specifically, one end of the screw rod 140-8 may be connected to the output shaft of the transmission 140-5 through the coupling 140-6.

The slide 140-9 may be nested on the screw rod 140-8. The slide 140-9 and the screw rod 140-8 may fit by threads. At least a part of the slide 140-9 may be located within a slide chute. The slide chute may be a portion of the slide rail. A rotation of the screw rod 140-8 may drive the slide 140-9 to move up and down along the slide chute. Specifically, the first driving device may drive the rotation of the screw rod 140-8, and a rotation displacement of the screw rod 140-8 may be converted into an up and down movement of the slide 140-9 along the screw rod 140-8. In some embodiments, an effective travel of the screw rod 140-8 may be 300 mm~1200 mm, a screw lead of the screw rod 140-8 may be 5-20 mm, and the diameter of the screw rod 140-8 diameter may be 16 mm~35 mm. By controlling the rotation speed of the first motor 140-4, a pulling speed required by the crystal growth may be achieved. In some embodiments, the pulling speed may be 0.1 mm/hour~10 mm/hour, a relatively fast pulling speed may be 0.1 mm/hour~3600 mm/hour, and an accuracy may be greater than 0.01 mm/hour.

It should be noted that, in some embodiments, a module (e.g., a KK module, a ball screw rod module, and other linear module) may be directly mounted on the pillar 140-2. The slide 140-9 may be mounted on a screw rod of the module. An output shaft of the first driving device may be connected to a screw rod of the module to drive an rotation of the screw rod. Further, a rotation displacement of the screw rod may be converted into an up and down movement of the slide 140-9 along the screw rod.

The weighing component 150 may be configured to determine a weight of the crystal on the pulling rod component. As shown in FIG. 10, the weighing component 150 may be mounted on the slide 140-9. The weighing component 150 may include a weighing chamber 150-1, a weighing sensor 150-2, and the pulling rod component. The pulling rod component may at least include a middle rod 150-3, a guide rod 150-4, and a seed rod. The weighing sensor 150-2 may be mounted inside the weighing chamber 150-1. As shown in FIG. 9, one end of the weighing sensor 150-2 may be fixedly connected to the pulling rod component. Specifically, one end of the weighing sensor 150-2 may be fixedly connected to the guide rod component of the pulling rod 150-4. The other end of the weighing sensor 150-2 may be fixedly connected to a cover plate of the weighing chamber 150-1. For example, the weighing chamber 150-1 may include a through hole in which a screw may be mounted to connect the weighing sensor 150-2. One end of the middle rod 150-3 may be fixedly connected to the weighing chamber 150-1. For example, one end of the middle rod 150-3 may be fixedly connected to the weighing chamber 150-1 by a bolt connection, a welding connection, a hinged connection, a buckle connection, etc. As another example, one end of the middle rod 150-3 may be fixedly connected to the weighing chamber 150-1 by other connection manners (e.g., a retractable hose).

The slide 140-9 may include a through hole 140-10. The middle rod 150-3 may pass through the third through hole 140-10 on the slide 140-10. Bearing(s) may be mounted above and below the through hole 140-10 to facilitate a rotation of the weighing chamber 150-1, thereby driving the pulling rod component to rotate. The middle rod 150-3 may include a hollow structure. The guide rod 150-4 may pass through the middle rod 150-3. One end of the guide rod 150-4 may be connected to the weighing sensor 150-2. The other end of guide rod 150-4 may be connected to the seed rod. One end of the seed rod may be connected to a seed crystal for crystal growth. In some embodiments, a baffle may be mounted on the slide 140-9. The baffle may eliminate an influence of hot air flow radiated through the first through hole 120-4 of the furnace cover 120-2 of the furnace chamber 120 on the weighing sensor 150-2 of the weighing chamber 150-1, making a fluctuation of weight signals to be smaller, the weighing to be more accurate, and the device to operate more smoothly.

Through the weighing component 150, an instant weight of the crystal may be measured, and be compared with an instant weight of a preset model. According to a control algorithm of the crystal growth automatic control system, continuous signals may be output to control a magnitude of an instant output power of the intermediate frequency power supply of the induction coil, and accurately control a temperature in the furnace, realizing an automatic control of the crystal growth process.

The rotating component 160 may be configured to control the rotation of the pulling rod. The rotating component 160 may drive the weighing chamber 150-1 to rotate, thereby driving the weighing component 150 to rotate and make the crystal connected to the pulling rod component 140 to rotate. In some embodiments, the rotating component 160 may only drive the weighing component 150 to rotate. Since the guide rod 150-4 of the weighing component 150 is connected to the seed rod, and the other end of the seed rod is connected to the seed crystal, the rotation of the weighing chamber 150-1 may drive the crystal to rotate. In some embodiments, the guide rod 150-4 may be fixedly or softly connected to the weighing sensor 150-2. A soft connection refers to that when the weighing chamber 150-1 does not move, the guide rod 150-4 may be under a force to move upward by a certain distance, or rotate freely left and right. The rotating component 160 may include a second driving device and a transmission component. The second driving device may include a second motor 160-1 and a second driver 160-3. The transmission component may include a belt pulley 160-2 and a belt 160-5. At least one belt 160-5 may be mounted on the belt pulley 160-2 and the weighing chamber 150-1. In some embodiments, the transmission component may include a gear chain transmission component including a gear and a chain. An output shaft of the second driving device may be connected to the gear. A gear structure may be mounted on an outer wall of the weighing chamber 150-1. The chain may be nested on the gear and the weighing chamber 150-1.

The rotating component 160 may also include a support component 160-4. The rotating component 160 may be mounted on the slide 140-9 through the support component 160-4. The support component 160-4 may be fixedly connected to the slide 140-9, for example, by a welding connection, a connection by one or more screws, a connection by one or more bolts, a connection by one or more pin joints.

An output spin axis of the second driving device may be connected to a spin axis of the belt pulley 160-2. The second driving device may drive the weighing component 150 to rotate through the transmission component. Specifically, an output spin axis of the second motor 160-1 may be connected to the spin axis of the belt pulley 160-2. The second driving device may drive the weighing component 150 to rotate through the transmission component. By controlling a rotation speed of the second motor 160-1, the rotation speed required by the crystal growth may be achieved. In some embodiments, the rotation speed may be 0.1-120 rpm and the precision may be 0.1 rpm.

Figure 11:
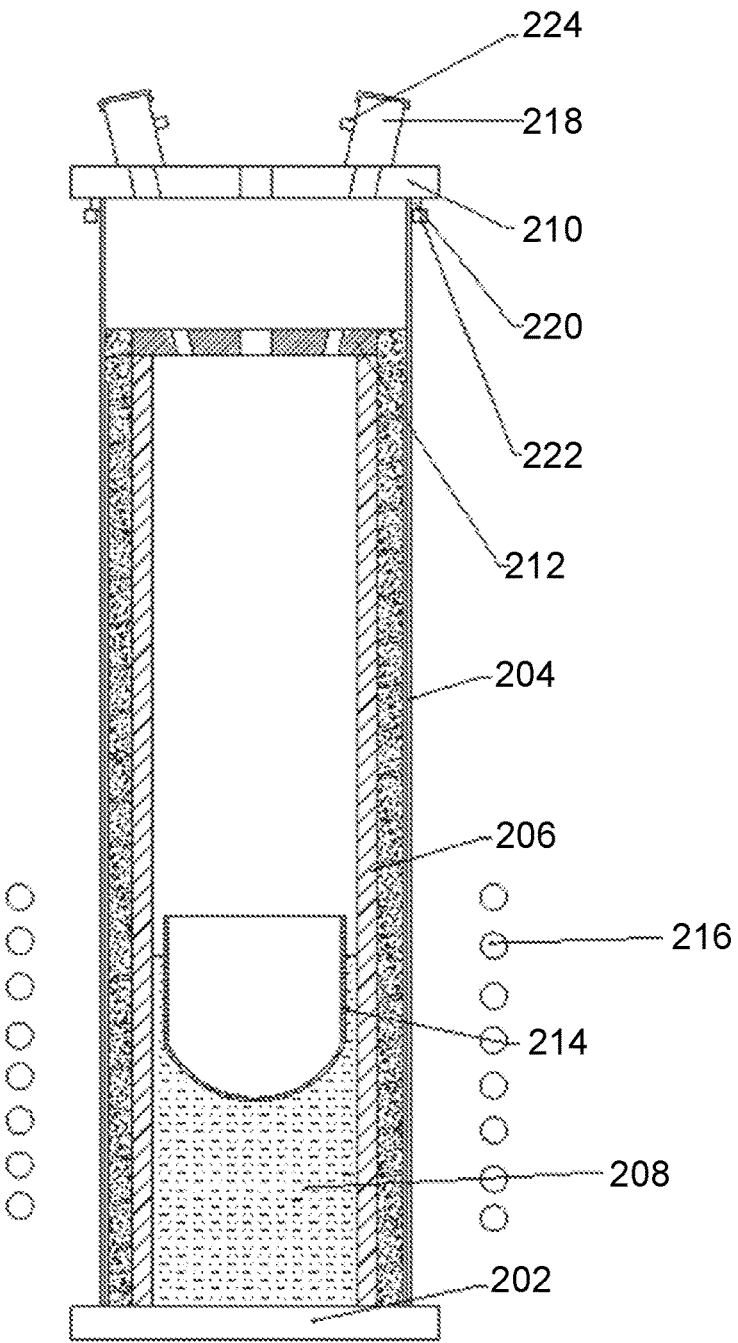
FIG. 11 is a schematic diagram illustrating an exemplary temperature field device according to some embodiments of the present disclosure.

FIG. 11 is a schematic diagram illustrating an exemplary temperature field device according to some embodiments of the present disclosure.

It should be noted that FIG. 11 is provided for illustration purposes and does not limit the specific shape and structure of the temperature field device. The temperature field device 200 may be placed in a crystal growth furnace to provide a temperature gradient required by crystal growth and ensure the stability of a crystallization process of the crystal. The temperature field device 200 may be cylindrical or have other pillar shapes, such as a polygonal prism. The external structure of the temperature field device 200 may generally consist of a first hollow pillar and two cover plates which cover two ends of the first hollow pillar. Specifically, the two cover plates may be connected to the two ends of the first hollow pillar in a connection manner such as a bonding connection, a welding connection, a riveting connection, a key connection, a bolt connection, a buckle connection, etc. Alternatively, one end of the first hollow pillar may be connected to one cover plate (e.g., by a detachable connection), and the other end of the first hollow pillar may be integrally formed with or non-detachably connected to another cover plate. A second hollow pillar with a height less than that of the first hollow pillar may be mounted inside the hollow pillar. A space between the first hollow pillar and the second hollow pillar, and/or a space inside the second hollow pillar may be filled with a substance for heat preservation. For example, the space between the first hollow pillar and the second hollow pillar may be filled with a substance for heat preservation, and the space inside the second hollow pillar may also be filled with a substance for heat preservation. As another example, the space between the first hollow pillar and the second hollow pillar may be filled with a substance for heat preservation, while the space inside the second hollow pillar may not be filled with a substance for heat preservation. As still another example, the space between the first hollow pillar and the second hollow pillar may not be filled with a substance for heat preservation, and the space inside the second hollow pillar may be filled with a substance for heat preservation. Meanwhile, the substance filled in the second hollow pillar may also support a crucible for placing reactants. Besides, an end of the second hollow pillar near a top of the first hollow pillar may be connected to an insulation board to further enhance the insulation effect. As shown in FIG. 11, the temperature field device 200 may include a bottom plate 202, a first drum 204, a second drum 206, a filler 208, a first cover plate 210, a second cover plate 212, an observation unit 218, a sealing ring 220, a pressure ring 222, and a gas channel 224. When the temperature filed component 200 is in use, the temperature field device 200 may be placed in the crystal growth furnace. Specifically, the temperature field device 20 may be placed in the induction coil 216 in the furnace, and a crucible 214 may be placed inside the temperature field device 200.

The bottom plate 202 may be mounted on a bottom of the temperature field device 200 to support other components (e.g., the first barrel 204, the second barrel 206, and/or filling body 208) of the temperature field device 200. In some embodiments, a material of the bottom plate 102 may include a heat-reflective material with a relatively high reflection coefficient, such as gold, silver, nickel, aluminum foil, copper, molybdenum, coated metal, stainless steel, etc. Preferably, the material of the bottom plate 202 may be copper. In some embodiments, a diameter of the bottom plate 202 may be 200 mm~500 mm. Preferably, the diameter of the bottom plate 202 may be 250 mm~450 mm. More preferably, the diameter of the bottom plate 202 may be 300 mm~400 mm. More preferably, the diameter of the bottom plate 202 may be 310 mm~390 mm. More preferably, the diameter of the bottom plate 202 may be 320 mm~380 mm. More preferably, the diameter of the bottom plate 202 may be 430 mm~370 mm. More preferably, the diameter of the bottom plate 202 may be 440 mm~360 mm. In some embodiments, a thickness of bottom plate 202 may be 10 mm~40 mm. Preferably, the thickness of the bottom plate 202 may be 15 mm~35 mm. More preferably, the thickness of the bottom plate 202 may be 20 mm~30 mm. More preferably, the thickness of the bottom plate 202 may be 21 mm~29 mm. More preferably, the thickness of the bottom plate 202 may be 22 mm~28 mm. More preferably, the thickness of the bottom plate 202 may be 23 mm~27 mm. More preferably, the thickness of the bottom plate 202 may be 24 mm~26 mm. Since the temperature field device 200 may be placed in a furnace body of a single crystal growth furnace when the temperature filed component 200 is in use, the bottom plate 202 may be placed or mounted on a mounting plate of the furnace body. A mode of placing or mounting the bottom plate 202 may include a welding connection, a riveting connection, a bolt connection, a bonding connection, etc. During the bottom plate 202 is being mounted, a level requirement of the bottom plate 202 may be less than 0.5 mm/m. mm/m may refer to a height difference (mm) between two ends of a unit length (m). Preferably, the level requirement of the bottom plate 202 may be less than 0.4 mm/m. More preferably, the level requirement of the bottom plate 202 may be less than 0.3 mm/m. More preferably, the level requirement of the bottom plate 202 may be less than 0.2 mm/m. More preferably, the level requirement of the bottom plate 202 may be less than 0.1 mm/m. More preferably, the level requirement of the bottom plate 202 may be less than 0.09 mm/m. More preferably, the level requirement of the bottom plate 202 may be less than 0.08 mm/m. More preferably, the level requirement of the bottom plate 202 may be less than 0.07 mm/m. More preferably, the level requirement of the bottom plate 202 may be less than 0.06 mm/m. More preferably, the level requirement of the bottom plate 202 may be less than 0.05 mm/m. More preferably, the level requirement of the bottom plate 202 may be less than 0.04 mm/m. More preferably, the level requirement of the bottom plate 202 may be less than 0.03 mm/m. More preferably, the level requirement of the bottom plate 202 may be less than 0.02 mm/m. More preferably, the level requirement of the bottom plate 202 may be less than 0.01 mm/m. When the temperature field device 200 is in use, an internal temperature may reach a relatively high temperature, for example, 1900° C. Therefore, it is necessary to reduce heat radiation of the temperature field device 200 to prevent the furnace body from being damaged by receiving excessive heat. In this case, the bottom plate 202 may be provided with circulating cooling medium channel(s), through which a circulating cooling medium may pass to absorb the heat inside the temperature field device 200, thereby insulating the heat and reducing the heat radiation. The circulating cooling medium channel(s) may be mounted inside the bottom plate 202 with a spiral shape or a snake shape. A cooling manner may include liquid cooling, wind cooling, gas cooling, or other manner that can achieve cooling purpose. When the liquid cooling is used, a cooling medium may include water, ethanol, ethylene glycol, isopropanol, n-hexane, or the like, or any combination thereof. For example, the cooling medium may include a 50:50 mixed liquid of water and ethanol. The cooling medium used may also include cooling oil. A count of the circulating cooling medium channel(s) may be one or more, for example, 1 to 3. In some embodiments, diameter(s) of the circulating cooling medium channel(s) may be 5 mm~25 mm. Preferably, the diameter (s) of the circulating cooling medium channel(s) may be 10 mm~20 mm. Preferably, the diameter(s) of the circulating cooling medium channel(s) may be 11 mm~19 mm. Preferably, the diameter(s) of the circulating cooling medium channel(s) may be 12 mm~18 mm. Preferably, the diameter(s) of the circulating cooling medium channel(s) may be 13 mm~17 mm. Preferably, the diameter(s) of the circulating cooling medium channel(s) may be 14 mm~15 mm.

The first drum 204 may be mounted on the bottom plate 202 and constitute an outer wall of the temperature field device 200. The bottom plate 202 may cover an open end of the first drum 204. The first drum 204 may be mounted on the bottom plate 202 to support the temperature field device 200. The first drum 204 may be mounted on the bottom plate 202 by a welding connection, a riveting connection, a bolt connection, a bonding connection, etc. Meanwhile, the first drum 204 may be used to achieve the sealing and the heat preservation of the temperature field device 200 together with other components (e.g., the bottom plate 202, the first cover plate 212, etc.) of the temperature field device 200. When the first drum 204 is being mounted, a concentricity of the first drum 204 and the bottom plate 202 may be less than 1 mm. More preferably, the concentricity of the first drum 104 and the bottom plate 102 may be less than 0.9 mm. More preferably, the concentricity of the first drum 104 and the bottom plate 102 may be less than 0.8 mm. More preferably, the concentricity of the first drum 104 and the bottom plate 102 may be less than 0.7 mm. More preferably, the concentricity of the first drum 104 and the bottom plate 102 may be less than 0.6 mm. More preferably, the concentricity of the first drum 104 and the bottom plate 102 may be less than 0.5 mm. More preferably, the concentricity of the first drum 204 and the bottom plate 202 may be less than 0.4 mm. More preferably, the concentricity of the first drum 204 and the bottom plate 202 may be less than 0.3 mm. More preferably, the concentricity of the first drum 204 and the bottom plate 202 may be less than 0.2 mm. More preferably, the concentricity of the first drum 204 and the bottom plate 202 may be less than 0.1 mm. A perpendicularity between the first drum 204 and the bottom plate 202 may be less than 0.2 degrees. More preferably, the perpendicularity of the first drum 204 and the bottom plate 202 may be less than 0.15 degrees. More preferably, the perpendicularity of the first drum 204 and the bottom plate 202 may be less than 0.1 degrees. More preferably, the perpendicularity of the first drum 204 and the bottom plate 202 may be less than 0.05 degrees. More preferably, the perpendicularity of the first drum 204 and the bottom plate 202 may be less than 0.03 degrees. In some embodiments, the first drum 204 may be made of quartz (silicon oxide), corundum (alumina), zirconium oxide, graphite, carbon fiber, ceramics, etc., or other heat resistant materials such as boride, carbide, nitride, silicide, phosphide, sulfide, etc. of rare-earth metals. Preferably, the first drum 204 may be a quartz tube or a corundum tube. According to a size of the bottom plate 202, an inner diameter of the first drum 204 may be 180 mm~450 mm. Preferably, the inner diameter of the first drum 204 may be 200 mm~530 mm. More preferably, the inner diameter of the first drum 204 may be 220 mm~510 mm. More preferably, the inner diameter of the first drum 204 may be 250 mm~380 mm. More preferably, the inner diameter of the first drum 204 may be 270 mm~360 mm. More preferably, the inner diameter of the first drum 204 may be 300 mm~330 mm. More preferably, the inner diameter of the first drum 204 may be 310 mm~320 mm. In some embodiments, a thickness of the first drum 204 be 1 mm~15 mm. Preferably, the thickness of the first drum 204 be 3 mm~12 mm. More preferably, the thickness of the first drum 204 be 5 mm~10 mm. More preferably, the thickness of the first drum 204 be 6 mm~9 mm. More preferably, the thickness of the first drum 204 be 7 mm~8 mm. A height of the first drum 204 may be 600 mm~1600 mm. Preferably, the height of the first drum 204 may be 700 mm~1500 mm. More preferably, the height of the first drum 204 may be 800 mm~1400 mm. More preferably, the height of the first drum 204 may be 900 mm~1300 mm. More preferably, the height of the first drum 204 may be 1000 mm~1200 mm. More preferably, the height of the first drum 204 may be 1050 mm~1150 mm. More preferably, the height of the first drum 204 may be 1060 mm~1140 mm. More preferably, the height of the first drum 204 may be 1070 mm~1130 mm. More preferably, the height of the first drum 204 may be 1080 mm~1120 mm. More preferably, the height of the first drum 204 may be 1090 mm~1110 mm. More preferably, the height of the first drum 204 may be 1095 mm~105 mm. The second drum 206 may be mounted inside the first drum 204. In some embodiments, the second drum 206 may be made of a material with relatively good heat resistance to maintain temperature stable during crystal growth stable. The second drum 206 may be made of silicon oxide, zirconium oxide, aluminum oxide, graphite, ceramics, etc. Preferably, the second drum 206 may be a zirconium tube made of zirconia. To match the size of the first drum 204, an inner diameter of the second drum 206 may be 70 mm~300 mm. Preferably, the inner diameter of the second drum 206 may be 100 mm~270 mm. More preferably, the inner diameter of the second drum 206 may be 120 mm~250 mm. More preferably, the inner diameter of the second drum 206 may be 150 mm~220 mm. More preferably, the inner diameter of the second drum 206 may be 170 mm~200 mm. More preferably, the inner diameter of the second drum 206 may be 180 mm~270 mm. A thickness of the second drum 206 may be 8 mm~30 mm. Preferably, the thickness of the second drum 206 may be 10 mm~30 mm. More preferably, the thickness of the second drum 206 may be 15 mm~25 mm. More preferably, the thickness of the second drum 206 may be 16 mm~24 mm. More preferably, the thickness of the second drum 206 may be 17 mm~23 mm. More preferably, the thickness of the second drum 206 may be 18 mm~22 mm. More preferably, the thickness of the second drum 206 may be 19 mm~21 mm. In some embodiments, one end of the second drum 206 may be placed or mounted on the bottom plate 202, for example, by a bonding connection, a welding connection, a riveting connection, a key connection, a bolt connection, a buckle connection, etc. When the second drum 206 is being mounted, a concentricity of the second drum 206 and the bottom plate 102 may be less than 1 mm. More preferably, the concentricity of the second drum 106 and the bottom plate 102 may be less than 0.9 mm. More preferably, the concentricity of the second drum 206 and the bottom plate 102 may be less than 0.8 mm. More preferably, the concentricity of the second drum 206 and the bottom plate 102 may be less than 0.7 mm. More preferably, the concentricity of the second drum 206 and the bottom plate 102 may be less than 0.6 mm. More preferably, the concentricity of the second drum 206 and the bottom plate 202 may be less than 0.5 mm. More preferably, the concentricity of the second drum 206 and the bottom plate 202 may be less than 0.4 mm. More preferably, the concentricity of the second drum 206 and the bottom plate 202 may be less than 0.3 mm. More preferably, the concentricity of the second drum 206 and the bottom plate 202 may be less than 0.2 mm. More preferably, the concentricity of the second drum 206 and the bottom plate 202 may be less than 0.1 mm. More preferably, the concentricity of the second drum 206 and the bottom plate 202 may be less than 0.05 mm. Meanwhile, a perpendicularity of the second drum 206 may be less than 0.2 degrees. More preferably, the perpendicularity of the second drum 206 may be less than 0.15 degrees. More preferably, the perpendicularity of the second drum 206 may be less than 0.1 degrees. More preferably, the perpendicularity of the second drum 206 may be less than 0.08 degrees. More preferably, the perpendicularity of the second drum 206 may be less than 0.05 degrees. In some embodiments, when the second drum 206 is mounted on the bottom plate 202, according to different lengths, the second drum 206 may be in different mounting states. When a length of the second drum 206 is the same as that of the first drum 204, a mounting state of the second drum 206 may be similar to that of the first drum 204, that is, one open end of the second drum 206 may be connected to the bottom plate 202 and the other open end of the second drum 206 may be connected to the first cover plate 210. When the length of the second drum 206 is smaller than the first drum 204, the other open end of the second drum 206 may be connected to other components (e.g., the second cover plate 212) of the temperature field device 200. The second cover plate 212 may cover the other open end of the second drum 206. Meanwhile, a size and/or a shape of the second cover plate 212 (e.g., a diameter of a circle cover plate) may be matched with a cross-section of the first drum 204 to achieve a seamless connection with the first drum 204. In some embodiments, the second drum 206 may not be mounted on the bottom plate 202. When the length of the second drum 206 is smaller than that of the first drum 204, one end of the second drum 206 may be mounted on other components (e.g., the first cover plate 210 and the second cover plate 212) of the temperature field device 200, and the other end of the second drum 206 may be kept at a certain distance from the bottom plate 202 (e.g., in a floating state). In some embodiments, the length of the second drum 206 may be consistent with that of the first drum 204. In some embodiments, the length of the second drum 206 may be 500 mm~1500 mm. More preferably, the length of the second drum 206 may be 600 mm~1400 mm. More preferably, the length of the second drum 206 may be 700 mm~1300 mm. More preferably, the length of the second drum 206 may be 800 mm~1200 mm. More preferably, the length of the second drum 206 may be 900 mm~1100 mm. More preferably, the length of the second drum 206 may be 950 mm~1050 mm. More preferably, the length of the second drum 206 may be 960 mm~1040 mm. More preferably, the length of the second drum 206 may be 970 mm~1030 mm. More preferably, the length of the second drum 206 may be 980 mm~1020 mm. More preferably, the length of the second drum 206 may be 990 mm~1010 mm.

The filler 208 may be filled in the second drum 206, and/or a space between the first drum 204 and the second drum 206. The filler 208 may be configured for heat preservation. In some embodiments, a thickness, a height, and/or a tightness of the filler 208 may change a position of a component (e.g., the crucible 214) supported by the filler 208, a space volume of the heat dissipation in the temperature field device 200, and/or a temperature gradient required by the crystal growth. By changing the thickness, the height and/or the tightness of the filler 208, different stable temperature gradients may be obtained to meet different crystal growth requirements. Meanwhile, when the second drum 206 cracks, the filler 208 filled in the space between the first drum 204 and the second drum 206 may act as a thermal insulation layer to prevent a change caused by a communication between the temperature field device 200 and the external environment, which may affect the crystal growth. The thermal insulation layer formed by the filler 208 may maintain the temperature gradient in the temperature field device 200 in the above-mentioned case to avoid the sudden change of the temperature field device. In some embodiments, the filler 208 may also buffer the sudden temperature change when the second drum 206 cracks. In some embodiments, the filler 208 may be made of a heat resistant material, such as silicon oxide, aluminum oxide, zirconium oxide, graphite, carbon fiber, ceramics, and boride, carbide, nitride, silicide, phosphide, sulfide, etc. of rare-earth metals, etc. In some embodiments, the filler 208 may include a zircon sand (a zirconium silicate compound), a zirconia particle, an alumina particle, a zirconia felt, a zirconia brick, an alumina brick, or other heat resistant materials. A particle size of the filler 208 may be 5 mesh~200 mesh. More preferably, the particle size of the filler 208 may be 10 mesh~190 mesh. More preferably, the particle size of the filler 208 may be 20 mesh~180 mesh. More preferably, the particle size of the filler 208 may be 30 mesh~170 mesh. More preferably, the particle size of the filler 208 may be 40 mesh~160 mesh. More preferably, the particle size of the filler 208 may be 50 mesh~150 mesh. More preferably, the particle size of the filler 208 may be 60 mesh~140 mesh. More preferably, the particle size of the filler 208 may be 70 mesh~130 mesh. More preferably, the particle size of the filler 208 may be 80 mesh~120 mesh. More preferably, the particle size of the filler 208 may be 90 mesh~110 mesh. More preferably, the particle size of the filler 208 may be 95 mesh~105 mesh. In some embodiments, the filler 208 may include a substance with a shape of felt (e.g. a zirconia felt). In some embodiments, the filler 208 may include a substance with a shape of brick (e.g., a zirconia brick, and/or an alumina brick). In some embodiments, the filler 208 may include a mixture of any two or more of a substance with a shape of granule, a shape of brick, or a shape of felt. For example, the filler 208 may include a mixture of a zirconia felt with one or more of a zirconia sand, a zirconia particle, an alumina particle, a zirconia brick, an alumina brick, or other heat resistance granular materials.

In some embodiments, the filler 208 filled in the second drum 206 may be configured to support the crucible 214 containing the reactants for crystal growth. The filler 208 may cover a portion of the crucible 214, for example, a bottom and a sidewall of the filler 208. To prevent the filler 208 from falling into the reactants in the crucible 214, an upper edge of the crucible 214 may be higher than the filling height of the filler 208 filled in the second drum 206. On the other hand, the second drum 206 may also prevent the filler 208 filled in the space between the first drum 204 and the second drum 206 from falling into the crucible 214. In some embodiments, the crucible 214 may be made of iridium (Ir), molybdenum (Mo), tungsten (W), rhenium (Re), graphite (C), tungsten-molybdenum alloy, or the like, or any combination thereof. Preferably, the crucible 214 may be an iridium crucible. In some embodiments, a diameter of the crucible 214 may be 60 mm~250 mm. More preferably, the diameter of the crucible 214 may be 80 mm~220 mm. More preferably, the diameter of the crucible 214 may be 100 mm~200 mm. More preferably, the diameter of the crucible 214 may be 110 mm~190 mm. More preferably, the diameter of the crucible 214 may be 120 mm~180 mm. More preferably, the diameter of the crucible 214 may be 130 mm~170 mm. More preferably, the diameter of the crucible 214 may be 140 mm~160 mm. More preferably, the diameter of the crucible 214 may be 145 mm~155 mm. The thickness of the crucible 214 may be 2 mm~4 mm. More preferably, the thickness of the crucible 214 may be 2.2 mm~3.8 mm. More preferably, the thickness of the crucible 214 may be 2.5 mm~3.5 mm. More preferably, the thickness of the crucible 214 may be 2.6 mm~3.4 mm. More preferably, the thickness of the crucible 214 may be 2.7 mm~3.3 mm. More preferably, the thickness of the crucible 214 may be 2.8 mm~3.2 mm. More preferably, the thickness of the crucible 214 may be 2.9 mm~0.1 mm. The height of the crucible 214 may be 60 mm~250 mm. More preferably, the height of the crucible 214 may be 80 mm~220 mm. More preferably, the height of the crucible 214 may be 100 mm~200 mm. More preferably, the height of the crucible 214 may be 110 mm~190 mm. More preferably, the height of the crucible 214 may be 120 mm~180 mm. More preferably, the height of the crucible 214 may be 130 mm~170 mm. More preferably, the height of the crucible 214 may be 140 mm~160 mm. More preferably, the height of the crucible 214 may be 145 mm~155 mm.

Figure 12:
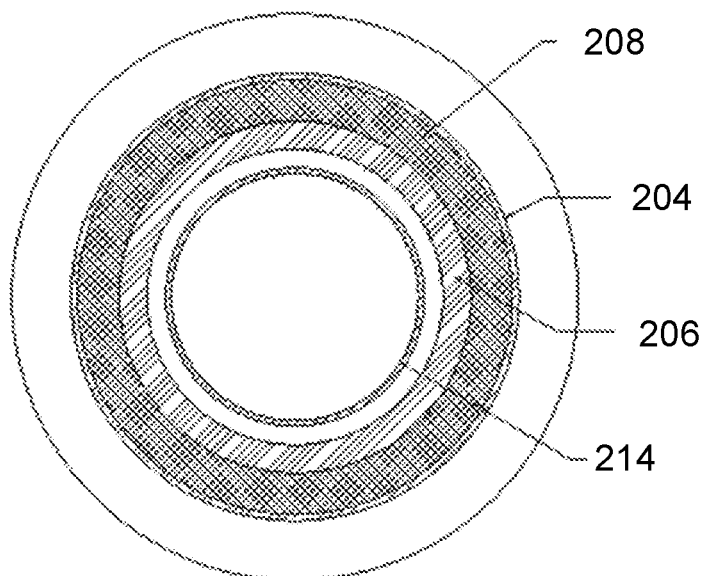
FIG. 12 is a schematic diagram illustrating a top view of a cross-section of an exemplary temperature field device according to some embodiments of the present disclosure.

FIG. 12 is a schematic diagram illustrating a top view of a cross-section of an exemplary temperature field device according to some embodiments of the present disclosure.

As shown in FIG. 12, a periphery of the temperature field device 200 may be the first drum 204. The space between the second drum 206 and the first drum 204 may be filled with the filler 208. The crucible 214 may be placed in the second drum 206, and supported by the filler 208 which is filled at a bottom of the second drum 206. It can be seen that, from outside to inside, components of the temperature field device 200 may successively include the first drum 204, the filler 208, the second drum 206, and the crucible 214. Meanwhile, the above-mentioned four components may form a concentric circle and a concentricity may be less than 1 mm. More preferably, the concentricity may be less than 0.9 mm. More preferably, the concentricity may be less than 0.8 mm. More preferably, the concentricity may be less than 0.7 mm. More preferably, the concentricity may be less than 0.6 mm. More preferably, the concentricity may be less than 0.5 mm. More preferably, the concentricity may be less than 0.4 mm. More preferably, the concentricity may be less than 0.3 mm. More preferably, the concentricity may be less than 0.2 mm. More preferably, the concentricity may be less than 0.1 mm. The formed concentric circle may be beneficial for growing crystals, observing the crystal growth, introducing flowing gas, and pulling up the crystals.

In some embodiments, the crucible 214 may be used as a heater to melt the reactants contained therein to facilitate subsequent crystal growth. An induction coil (e.g., the induction coil 216 illustrated in FIG. 11) surrounding the outer wall of the first drum 204 may generate an alternating magnetic field when an alternating current with a certain frequency is passed. A closed induced current (i.e., an eddy current) may be generated in a conductor (e.g., the crucible 214) caused by the electromagnetic induction of the alternating magnetic field. The induced current may be unevenly distributed on a cross-section of the conductor and the electrical energy of a high-density current on a surface of the conductor may be converted into heat energy to increase the temperature of the conductor to melt the reactants. The induction coil 216 may include a coil with 7 turns~12 turns. More preferably, the induction coil 216 may include a coil with 8 turns~11 turns. More preferably, the induction coil 216 may include a coil with 9 turns~10 turns. An induction frequency may be 2 kHz~15 kHz. More preferably, the induction frequency may be 3 kHz~14 kHz. More preferably, the induction frequency may be 4 kHz~13 kHz. More preferably, the induction frequency may be 5 kHz~12 kHz. More preferably, the induction frequency may be 6 kHz~11 kHz. More preferably, the induction frequency may be 7 kHz~10 kHz. More preferably, the induction frequency may be 8 kHz~9 kHz. In some embodiments, the filling height of the filler 208 may result in that a vertical distance between an upper edge of the crucible 214 and an upper edge of the induction coil 216 is 0 mm~∓50 mm (i.e., −50 mm~50 mm), wherein, "−" represents that the upper edge of the crucible 214 is lower than the upper edge of the induction coil 216, and "+" represents that the upper edge of the crucible 214 is higher than the upper edge of the induction coil 216. More preferably, the vertical distance between the upper edge of the crucible 214 and the upper edge of the induction coil 216 may be −5 mm~+45 mm. More preferably, the vertical distance between the upper edge of the crucible 214 and the upper edge of the induction coil 216 may be −40 mm~+40 mm. More preferably, the vertical distance between the upper edge of the crucible 214 and the upper edge of the induction coil 216 may be −35 mm~+35 mm. More preferably, the vertical distance between the upper edge of the crucible 214 and the upper edge of the induction coil 216 may be −30 mm~+30 mm. More preferably, the vertical distance between the upper edge of the crucible 214 and the upper edge of the induction coil 216 may be −25 mm~+25 mm. The temperature gradient of the temperature field device 200 can be adjusted by changing a relative position between the crucible 214 and the induction coil 216. For example, when the crucible 214 is totally within the coil range of the induction coil 216, the heat generated by the crucible 214 may be relatively large; whereas, when only a portion of the crucible 214 is in the coil range of the induction coil 216, the heat generated by the crucible 214 may be relatively small, accordingly, the heat position and/or a space size of heat dissipation in the temperature field device 200 may be determined, and the temperature gradient may be further affected.

The first cover plate 210 may be mounted on a top of the temperature field device 200, and may be used to seal the temperature field device 200 together with other components (e.g., the first drum 204). The first cover plate 210 may cover the other open end of the first drum 204. The first cover plate 210 may be connected to the first drum 204 by a welding connection, a riveting connection, a bolt connection, a bonding connection, or the like. For example, a silicone sealing ring may be used at a joint between the first cover plate 210 and the first drum 204, and a screw may be used to screw and seal the first cover plate 210 and the first drum 204. In some embodiments, a material of the first cover plate 210 may be similar to that of the bottom plate 202. The first cover plate 210 may be made of a heat-reflective material with a relatively high reflection coefficient, such as gold, silver, nickel, aluminum foil, copper, molybdenum, coated metal, stainless steel, etc. Preferably, the first cover plate 210 may be a copper plate. When the first cover plate 210 is being mounted, a concentricity of the first cover plate 210 and the first drum 204 may be less than 0.5 mm. More preferably, the concentricity of the first cover plate 210 and the first drum 204 may be less than 0.4 mm. More preferably, the concentricity of the first cover plate 210 and the first drum 204 may be less than 0.3 mm. More preferably, the concentricity of the first cover plate 210 and the first drum 204 may be less than 0.2 mm. More preferably, the concentricity of the first cover plate 210 and the first drum 204 may be less than 0.1 mm. In some embodiments, a diameter of the first cover plate 210 may be 200 mm~500 mm. More preferably, the diameter of the first cover plate 210 may be 250 mm~450 mm. More preferably, the diameter of the first cover plate 210 may be 300 mm~400 mm. More preferably, the diameter of the first cover plate 210 may be 310 mm~390 mm. More preferably, the diameter of the first cover plate 210 may be 320 mm~380 mm. More preferably, the diameter of the first cover plate 210 may be 330 mm~370 mm. More preferably, the diameter of the first cover plate 210 may be 340 mm~360 mm. In some embodiments, a thickness of the first cover plate 210 may be 10 mm~40 mm. More preferably, the thickness of the first cover plate 210 may be 15 mm~~35 mm. More preferably, the thickness of the first cover plate 210 may be 20 mm~30 mm. More preferably, the thickness of the first cover plate 210 may be 21 mm~29 mm. More preferably, the thickness of the first cover plate 210 may be 22 mm~28 mm. More preferably, the thickness of the first cover plate 210 may be 23 mm~27 mm. More preferably, the thickness of the first cover plate 210 may be 24 mm~26 mm. In some embodiments, the first cover plate 210 may include at least one fourth through hole. The at least one fourth through hole may be configured to pass a gas through. For example, the at least one fourth through hole may constitute a channel for the gas to enter into and/or exit from the temperature field device 200. The gas may be introduced into the temperature field device 200 through at least one fourth through hole and be discharged from the temperature field device 200 through remaining fourth through hole(s) or the fourth through hole(s) through which the gas is introduced. In some embodiments, the gas may include one or more of oxygen and/or inert gas(es). The inert gas(es) may include nitrogen, helium, neon, argon, krypton, xenon, radon, etc. In some embodiments, the gas may include a combination of oxygen with one or more inert gases. In some embodiments, the gas may include a mixed gas of hydrogen and/or carbon monoxide with one or more inert gases. In some embodiments, the gas may include one or more of nitrogen, argon, oxygen, or carbon monoxide. According to the characteristics and size of the crystal to be grown, a flow rate of the gas introduced into the temperature field device 200 may be 0.01 L/min~50 L/min. More preferably, the flow rate of the introduced gas may be 0.01 L/min~50 L/min. More preferably, the flow rate of the introduced gas may be 0.1 L/min~50 L/min. More preferably, the flow rate of the introduced gas may be 1 L/min~50 L/min. More preferably, the flow rate of the introduced gas may be 5 L/min~45/min. More preferably, the flow rate of the introduced gas may be 10 L/min~40 L/min. More preferably, the flow rate of the introduced gas may be 15 L/min~35 L/min. Preferably, the flow rate of the introduced gas may be 20 L/min~30 L/min. More preferably, the flow rate of the introduced gas may be 21 L/min~29 L/min. More preferably, the flow rate of the introduced gas may be 22 L/min~28 L/min. More preferably, the flow rate of the introduced gas may be 23 L/min~27 L/min. More preferably, the flow rate of the introduced gas may be 24 L/min~26 L/min.

In some embodiments, other components may be mounted on the first cover plate 210.

Figure 13:
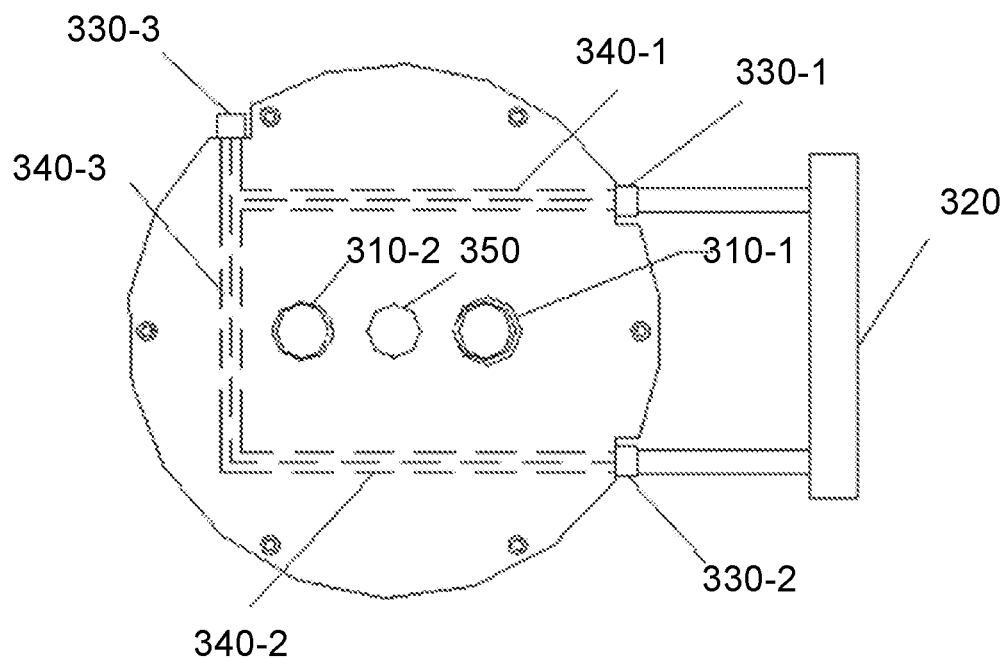
FIG. 13 is a schematic diagram illustrating a top view of an exemplary first cover plate according to some embodiments of the present disclosure.

FIG. 13 is a schematic diagram illustrating a top view of an exemplary first cover plate according to some embodiments of the present disclosure.

As shown in FIG. 13, the first cover plate 210 may include two fourth through holes 310-1 and 310-2 through which a gas may enter into and/or exit from the temperature field device 200. In some embodiments, diameters of the fourth through holes 310-1 and 310-2 may be 15 mm~30 mm. More preferably, the diameters of the fourth through holes 310-1 and 310-2 may be 18 mm~27 mm. More preferably, the diameters of the fourth through holes 310-1 and 310-2 may be 20 mm~25 mm. More preferably, the diameters of the fourth through holes 310-1 and 310-2 may be 21 mm~24 mm. More preferably, the diameters of the fourth through holes 310-1 and 310-2 may be 22 mm~23 mm. In some embodiments, rotation central axes of the fourth through holes 310-1 and 310-2 may be perpendicular to the horizontal plane. In some embodiments, the rotation central axes of the fourth through holes 310-1 and 310-2 may form angles of 3 degrees~20 degrees with a vertical line of the horizontal plane. More preferably, the rotation central axes of the fourth through holes 310-1 and 310-2 may form angles of 5 degrees~18 degrees with the vertical line of the horizontal plane. More preferably, the rotation central axes of the fourth through holes 310-1 and 310-2 may form angles of 7 degrees~15 degrees with the vertical line of the horizontal plane. More preferably, the rotation central axes of the fourth through holes 310-1 and 310-2 may form angles of 9 degrees~13 degrees with the vertical line of the horizontal plane. More preferably, the rotation central axes of the first through hole 310-1 and 310-2 may form angles of 11-12 degrees with the vertical line of the horizontal plane. A distance between centers of the two through holes may be 70 mm~150 mm. More preferably, the distance between the centers of two through holes may be 80 mm~140 mm. More preferably, the distance between the centers of two through holes may be 90 mm~130 mm. More preferably, the distance between the centers of two through holes may be 100 mm~120 mm. More preferably, the distance between the centers of two through holes may be 105 mm~115 mm. More preferably, the distance between the centers of two through holes may be 10 mm~113 mm. More preferably, the distance between the centers of two through holes may be 109 mm~111 mm.

In some embodiments, an observation unit 218 may be mounted above the fourth through holes 310-1 and 310-2. Since the crystal growth period is relatively long (which may reach 5-40 days), a unit through which the internal situation of the temperature field device 200 can be observed may be mounted on the temperature field device 200. A user (e.g., a worker in a factory) can observe the growth of the crystal through the observation unit 218. If an abnormal situation is found, timely remedial action can be executed.

Figure 14:
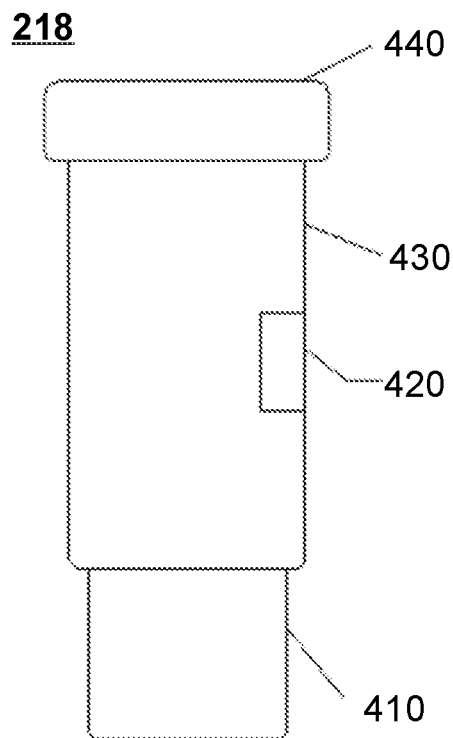
FIG. 14 is a schematic diagram illustrating an exemplary observation unit according to some embodiments of the present disclosure.

FIG. 14 is a schematic diagram illustrating an exemplary observation unit according to some embodiments of the present disclosure.

The observation unit 218 may be a tubular device with a closed end and an open end. The observation unit 218 may include a first part 410. A size of the first part 410 may be matched with that of the fourth through hole 310-1/310-2 of the first cover plate 210, thereby realizing a connection between the observation unit 218 and the first cover plate 210, for example, by a riveting connection, a screw connection, etc. Meanwhile, a lower end of the first part 410 may be open, accordingly, after the observation unit 218 is connected with the first cover plate 210, a connection between an inner chamber of the observation unit 218 and the fourth through hole 310-1/310-2 can be achieved. According to the diameter of the fourth through hole 310-1/310-2, a diameter of the first part may be 15 mm~30 mm. More preferably, the diameter of the first part 410 may be 18 mm~27 mm. More preferably, the diameter of the first part 410 may be 20 mm~25 mm. More preferably, the diameter of the first part 410 may be 21 mm~24 mm. More preferably, the diameter of the first part 410 may be 22 mm~23 mm. The observation unit 218 may further include a seventh through hole 420. The seventh through hole 420 may be opened at any position of a second part 430 of the observation unit 218 and may be connected with the inner chamber of the observation unit 218. After the observation unit 218 is connected to the fourth through hole 310-1/310-2, the seventh through hole 420 may be configured to realize the function of gas passing. In some embodiments, a diameter of the seventh through hole 420 may be 3 mm~10 mm. More preferably, the diameter of the seventh through hole 420 may be 4 mm~9 mm. More preferably, the diameter of the seventh through hole 420 may be 5-8 mm. More preferably, the diameter of the seventh through hole 420 may be 6 mm~7 mm. The second part 430 may be a part that is protruded outside the first cover plate 210 after the observation unit 218 is connected to the fourth through hole 310-1/310-2, and a height of the second part 430 may be 50 mm~100 mm. More preferably, the height of the second part 430 may be 60 mm~90 mm. Preferably, the height of the second part 430 may be 70 mm~80 mm. More preferably, the height of the second part 430 may be 71 mm~79 mm. More preferably, the height of the second part 430 may be 72 mm~78 mm. More preferably, the height of the second part 430 may be 73 mm~77 mm. More preferably, the height of the second part 430 may be 74 mm~76 mm. In some embodiments, the diameter of the second part 430 may be 26 mm~66 mm. More preferably, the diameter of the second part 430 may be 30 mm~60 mm. More preferably, the diameter of the second part 430 may be 35 mm~55 mm. More preferably, the diameter of the second part 430 may be 40 mm~50 mm. More preferably, the diameter of the second part 430 may be 41 mm~49 mm. More preferably, the diameter of the second part 430 may be 42 mm~48 mm. More preferably, the diameter of the second part 430 may be 43 mm~47 mm. More preferably, the diameter of the second part 430 may be 44 mm~46 mm. The observation unit 218 may further include an observation window 440. The observation window 440 may be mounted on a top of the observation unit 218, and may be made of a transparent material such as quartz, polymethyl methacrylate (PMMA), polystyrene (PS), polycarbonate (PC), etc. The user (e.g., the worker in the factory) may observe an internal situation of the temperature field device 200 through the observation window 440.

Similarly, in order to reduce heat radiation emitted from the upper of the temperature field device 200, circulating cooling medium channel(s) may be mounted on the first cover plate 210. Refer back to FIG. 13, as shown in FIG. 13, the first cover plate 210 may include a cooling medium channel 320. A cooling manner may include liquid cooling, wind cooling, gas cooling, or other manner that can achieve cooling purpose. When the liquid cooling is used, a cooling medium may flow through the cooling medium channel 320. The cooling medium may include water, ethanol, ethylene glycol, isopropanol, n-hexane or the like, or any combination thereof. For example, the cooling medium may include a 50:50 mixed liquid of water and ethanol. Through cooling medium inlets 330-1 and/or 330-2, the cooling medium may flow into the circulating cooling medium channels 340-1, 340-2, and 340-3 which are mounted inside the first cover plate 210. After absorbing heat dissipated from the temperature field device 200, the cooling medium may flow out through a cooling medium outlet 330-3. The flowed out cooling medium may return to the cooling medium channel 320 through other channels, and a next cycle may be performed. In some embodiments, diameters of the circulating cooling medium channels 340-1, 340-2, and 340-3 may be 5 mm~25 mm. More preferably, the diameters of the circulating cooling medium channels 340-1, 340-2, and 340-3 may be 10 mm~20 mm. More preferably, the diameters of the circulating cooling medium channels 340-1, 340-2, and 340-3 may be 11 mm~19 mm. More preferably, the diameters of the circulating cooling medium channels 340-1, 340-2, and 340-3 may be 12 mm~18 mm. More preferably, the diameters of the circulating cooling medium channels 340-1, 340-2, and 340-3 may be 13 mm~17 mm. More preferably, the diameters of the circulating cooling medium channels 340-1, 340-2, and 340-3 may be 14 mm~15 mm.

In some embodiments, the first cover plate 210 may further include a fifth through hole 350. For example, when the crystal growth is executed based on the Czochralski technique, a channel (e.g., the fifth through hole 350) for a pulling rod to enter into and/or exit from the temperature field device 200 may be mounted on the first cover plate 210. The fifth through hole 350 may mounted at a center of the first cover plate 210. A size of the fifth through hole 350 may be determined based on a size of the pulling rod. In some embodiments, a shape of the fifth through hole 350 may be various. The shape of the fifth through hole may include a regular shape such as a circle, a square, a rectangle, a diamond, a regular triangle, or any other irregular shape. In some embodiments, an area of the fifth through hole 350 may be 100 $mm^2$~3000 $mm^2$. More preferably, the area of the fifth through hole 350 may be 200 $mm^2$~2900 $mm^2$. More preferably, the area of the fifth through hole 350 may be 300 $mm^2$~2800 $mm^2$. More preferably, the area of the fifth through hole 350 may be 400 $mm^2$~2700 $mm^2$. More preferably, the area of the fifth through hole 350 may be 500 $mm^2$~2600 $mm^2$. More preferably, the area of the fifth through hole 350 may be 600 $mm^2$~2500 $mm^2$. More preferably, the area of the fifth through hole 350 may be 700 $mm^2$~2400 $mm^2$. More preferably, the area of the fifth through hole 350 may be 800 $mm^2$~2300 $mm^2$. More preferably, the area of the fifth through hole 350 may be 900 $mm^2$~2200 $mm^2$. More preferably, the area of the fifth through hole 350 may be 1000 $mm^2$~2100 $mm^2$. More preferably, the area of the fifth through hole 350 may be 1100 $mm^2$~2000 $mm^2$. More preferably, the area of the fifth through hole 350 may be 1200 $mm^2$~1900 $mm^2$. More preferably, the area of the fifth through hole 350 may be 1300 $mm^2$~1800 $mm^2$. More preferably, the area of the fifth through hole 350 may be 1400 $mm^2$~1700 $mm^2$. More preferably, the area of the fifth through hole 350 may be 1500 $mm^2$~1600 $mm^2$. When the fifth through hole 350 is a circular through hole, its diameter may be 25 mm~30 mm. More preferably, the diameter of the fifth through hole 350 may be 26 mm~29 mm. More preferably, the diameter of the fifth through hole 350 may be 27 mm~28 mm.

The second cover plate 212 may be mounted inside the first drum 204, cover the open end of the second drum 206 near the first cover plate 210, and be connected to the second drum 206 by a welding connection, a riveting connection, a bolt connection, a bonding connection, etc. In some embodiments, the second cover plate 212 may be made of a material with relatively good heat preservation performance to achieve heat preservation and heat insulation functions. The second cover plate 212 may include an alumina plate, a zirconia plate, a ceramic plate, a metal plate, etc., or a plate made of other heat resistant material such as boride, carbide, nitride, silicide, phosphide, sulfide, etc. of rare-earth metals. In some embodiments, a diameter of the second cover plate 212 may be determined based on the inner diameter of the first drum 204. The second cover plate 212 may fit the inner wall of the first drum 204. Since one end of the second drum 206 is completely covered, the filler 208 filled between the first drum 204 and the second drum 206 may be prevented from falling out and polluting the reactants in the crucible 214. In order to observe the internal situation of the temperature field device 200 from outside in existence of the second cover plate 212, through holes (also referred to as sixth through holes) corresponding to the through holes (e.g., the fourth through hole 310-1/310-2, the fifth through hole 350) on the first cover plate 210 may be opened on the second cover plate 212. The sixth through holes may have same rotation central axes as the fourth through holes and the fifth through hole. That is, the sixth through holes may be opened on the second cover plate 212 along the rotation central axes of the fourth and fifth through holes. In some embodiments, diameters of sixth through holes corresponding to the fourth through hole 310-1/310-2 may be 8 mm~15 mm. More preferably, the diameters of the sixth through holes corresponding to the fourth through hole 310-1/310-2 may be 9 mm~14 mm. More preferably, the diameters of the sixth through holes corresponding to the fourth through hole 310-1/310-2 may be 10 mm~13 mm. More preferably, the diameters of the sixth through holes corresponding to the fourth through hole 310-1/310-2 may be 11 mm~12 mm. The rotation central axes of the sixth through holes corresponding to the fourth through hole 310-1/310-2 may form angles of 3 degrees~20 degrees with the vertical line of the horizontal plane. More preferably, the rotation central axes of the sixth through holes corresponding to the fourth through hole 310-1/310-2 may form angles of 5 degrees~18 degrees with the vertical line of the horizontal plane. More preferably, the rotation central axes of the sixth through holes corresponding to the fourth through hole 310-1/310-2 may form angles of 7 degrees~15 degrees with the vertical line of the horizontal plane. More preferably, the rotation central axes of the sixth through holes corresponding to the fourth through hole 310-1/310-2 may form angles of 9 degrees~13 degrees with the vertical line of the horizontal plane. More preferably, the rotation central axes of the sixth through holes corresponding to the fourth through hole 310-1/310-2 may form angles of 11 degrees~12 degrees with the vertical line of the horizontal plane. A distance between centers of the sixth through holes corresponding to the fourth through hole 310-1/310-2 may be 50 mm~140 mm. More preferably, the distance between the centers of the sixth through holes corresponding to the fourth through hole 310-1/310-2 may be 60 mm~130 mm. More preferably, the distance between the centers of the sixth through holes corresponding to the fourth through hole 310-1/310-2 may be 70 mm~120 mm. More preferably, the distance between the centers of the sixth through holes corresponding to the fourth through hole 310-1/310-2 may be 80 mm~110 mm. More preferably, the distance between the centers of the sixth through holes corresponding to the fourth through hole 310-1/310-2 may be 90 mm~100 mm. More preferably, the distance between the centers of the sixth through holes corresponding to the fourth through hole 310-1/310-2 may be 91 mm~99 mm. More preferably, the distance between the centers of the sixth through holes corresponding to the fourth through hole 310-1/310-2 may be 92 mm~98 mm. More preferably, the distance between the centers of the sixth through holes corresponding to the fourth through hole 310-1/310-2 may be 93 mm~97 mm. More preferably, the distance between the centers of the sixth through holes corresponding to the fourth through hole 310-1/310-2 may be 94 mm~96 mm. In some embodiments, a diameter of a sixth through hole corresponding to the fifth through hole may be 10 mm~150 mm. More preferably, the diameter of the sixth through hole corresponding to the fifth through hole may be 20 mm~140 mm. More preferably, the diameter of the sixth through hole corresponding to the fifth through hole may be 30 mm~130 mm. More preferably, the diameter of the sixth through hole corresponding to the fifth through hole may be 40 mm~120 mm. More preferably, the diameter of the sixth through hole corresponding to the fifth through hole may be 40 mm~110 mm. More preferably, the diameter of the sixth through hole corresponding to the fifth through hole may be 60 mm~100 mm. More preferably, the diameter of the sixth through hole corresponding to the fifth through hole may be 70 mm~90 mm. More preferably, the diameter of the sixth through hole corresponding to the fifth through hole may be 75 mm~85 mm. The diameter of the sixth through hole corresponding to the fifth through hole may affect the amount of heat dissipated through the sixth through hole, thereby affecting the temperature gradient of the temperature field device 200. Therefore, by changing the diameter of the sixth through hole corresponding to the fifth through hole, the temperature gradient of the temperature field device 200 can be adjusted. Meanwhile, an automatic feeder (not shown) may be used at the fourth through hole 310-1/310-2 and corresponding sixth through holes, which can automatically add reactants to the crucible 214. In this case, a concentration gradient caused by the reactants during the crystal growth process may be constant, which is beneficial to the uniformity and consistency of the crystal growth.

In some embodiments, a thickness of the second cover plate 212 may be 20 mm~35 mm. More preferably, the thickness of the second cover plate 212 may be 25 mm~30 mm. More preferably, the thickness of the second cover plate 212 may be 26 mm~29 mm. More preferably, the thickness of the second cover plate 212 may be 27 mm~28 mm. In some embodiments, a position of the second cover plate 212 in the temperature field device 200 may be determined based on the length and the mounting position of the second drum 206. When the length of the second drum 206 is greater than a length threshold, the second cover plate 212 may be close to the first cover plate 210. A certain distance may be maintained between the second cover plate 212 and the first cover plate 210.

The sealing ring 220 and the pressure ring 222 may achieve a seal between the first drum 204 and the first cover plate 210. In some embodiments, the sealing ring 220 may be mounted at the joint between the first drum 204 and the first cover plate 210, The sealing ring 220 may be made of a material having a certain elasticity, for example, silicone or rubber. An inner diameter of the sealing ring 220 may be less than or equal to the outer diameter of the first drum 214, so that when the sealing ring 220 is mounted, the sealing ring 220 may be stretched to seal effectively the space between the first drum 204 and the first cover plate 210. In some embodiments, the inner diameter of the sealing ring 220 may be 170 mm~440 mm. More preferably, the inner diameter of the sealing ring 220 may be 200 mm~410 mm. More preferably, the inner diameter of the sealing ring 220 may be 250 mm~350 mm. More preferably, the inner diameter of the sealing ring 220 may be 260 mm~340 mm. More preferably, the inner diameter of the sealing ring 220 may be 270 mm~330 mm. More preferably, the inner diameter of the sealing ring 220 may be 280 mm~320 mm. More preferably, the inner diameter of the sealing ring 220 may be 290 mm~310 mm. A wire diameter of the sealing ring 220 may be 5 mm~10 mm. More preferably, the wire diameter of the sealing ring 220 may be 6 mm~9 mm. More preferably, the wire diameter of the sealing ring 220 may be 7 mm~8 mm.

The pressure ring 222 may be configured to perform a fixing and compressing function for the sealing ring 220. In some embodiments, a shape of the pressure ring 222 may be matched with that of the first drum 204, and an inner diameter of the pressure ring 222 may be greater than the outer diameter of the first drum 204. In this case, the pressure ring 222 may be nested on the first drum 204 and may be movable. The pressure ring 222 may include a threaded hole corresponding to the first cover plate 210. When the pressure ring 222 is being mounted, the sealing ring 220 may be mounted between the pressure ring 222 and the first cover plate 210. The pressure ring 222 may be connected to the first cover plate 210 by threads, thereby compressing the sealing ring 220, enlarging a contact surface between the pressure ring 222 and the space between the first drum 204 and the first cover plate 210, causing the contact tight, and achieving the purpose of effective sealing. In some embodiments, other items (e.g., a vacuum grease) may be used to achieve the sealing. When the sealing ring 220 is being mounted, the sealing ring 220 may be covered with the vacuum grease to achieve more effective sealing. In some embodiments, the pressure ring 122 and the first cover plate 110 may also be connected by a buckle connection. In some embodiments, an outer diameter of the pressure ring 222 may be 200 mm~500 mm. More preferably, the outer diameter of the pressure ring 222 may be 250-450 mm. More preferably, the outer diameter of the pressing ring 222 may be 300 mm~400 mm. More preferably, the outer diameter of the pressing ring 222 may be 310 mm~390 mm. More preferably, the outer diameter of the pressing ring 222 may be 320 mm~380 mm. More preferably, the outer diameter of the pressing ring 222 may be 330 mm~370 mm. More preferably, the outer diameter of the pressure ring 222 may be 340 mm~360 mm. More preferably, the outer diameter of the pressing ring 222 may be 345 mm~355 mm. An inner diameter of the pressure ring 222 may be 190 mm~460 mm. More preferably, the inner diameter of the pressure ring 222 may be 220 mm~430 mm. More preferably, the inner diameter of the pressing ring 222 may be 250 mm~400 mm. Preferably, the inner diameter of the pressure ring 222 may be 280 mm~420 mm. More preferably, the inner diameter of the pressing ring 222 may be 300 mm~400 mm. Preferably, the inner diameter of the pressure ring 222 may be 310 mm~390 mm. More preferably, the inner diameter of the pressing ring 222 may be 310 mm~390 mm. Preferably, the inner diameter of the pressing ring 222 may be 320 mm~380 mm. More preferably, the inner diameter of the pressure ring 222 may be 330 mm~370 mm. Preferably, the inner diameter of the pressure ring 222 may be 340 mm~360 mm. More preferably, the inner diameter of the pressure ring 222 may be 345 mm~355 mm. A thickness of the pressing ring 222 may be 8 mm~15 mm. More preferably, the thickness of the pressing ring 222 may be 10 mm~13 mm. More preferably, the thickness of the pressing ring 222 may be 11 mm~12 mm.

In some embodiments, the temperature field device 200 may further include a gas channel 224. The gas channel 224 may be mounted on the observation unit 218, and a size of the gas channel 224 may be matched with that of the seventh through hole 420 to form a through tube protruding from the observation unit 218. In this case, the gas channel 224 may be connected to a gas inlet tube and/or a gas outlet tube to introduce the gas into the temperature field device 200.

In some embodiments, the temperature field device 200 may be applied in crystal growth. After being weighed and performed a preprocessing operation (e.g., an operation of high-temperature baking, room temperature mixing, isostatic pressing) according to a reaction equation, the reactants for growing crystals may be placed in the crucible 214 for reaction. Different crystals may require different growth conditions, for example, different temperature gradients. Accordingly, the temperature gradient may be adjusted by changing an amount and a tightness of the filler 208 (e.g., the filler 208 filled in the second drum 206) filled in the temperature field device 200. For example, the amount of the filler 208 may determine the relative position of the crucible 214 and the induction coil 216, and further determine a heating center of the temperature field. Meanwhile, the higher the tightness of the filler 208 is, the better the heat insulation capacity and the stability of the formed temperature field may be, and the more beneficial for crystal growth may be. After the amount and the tightness of the filler 208 are determined, other components may be mounted and sealed. After all the components are mounted, a gas may be introduced into the temperature field device 200, and an auxiliary component (e.g., a cooling circulation pump) may be activated to introduce a cooling medium to the circulating cooling medium channel(s) in the bottom plate 202 and the first cover plate 210. Then, the crystal growth apparatus (including the temperature field device 200) may be activated to start the crystal growth. The gas introduced into the temperature field device 200 may enter through one or more fourth through holes (e.g., one or more gas channels 224). The gas exiting from the temperature field device 200 may be discharged through the remaining fourth through holes (e.g., one or more gas channels 224), the fourth through hole(s) through which the gas is introduced, or the fifth through hole. Through processes such as seed crystal preheating, seeding, necking, shouldering, diameter-constant control, ending, cooling, and crystal taking, the crystal growth process may be finalized.

The crystal growth apparatus may achieve following beneficial effects: 1. an open furnace chamber is designed to grow single crystal materials of various types of heat resistance oxides (e.g. YAG (yttrium aluminum garnet), LSO (lutetium oxyorthosilicate)), solving the problem that a traditional vacuum furnace needs to firstly pump a high vacuum and secondly recharge a protecting gas, thereby improving the apparatus safety; 2. by comparing an instant weight measured through the weighing component with an instant weight of a preset model and according to a specific control algorithm, continuous signals are output to control a magnitude of the instant output power of the intermediate frequency power supply, thereby accurately controlling the temperature in the furnace; 3. a structure of the furnace body is simplified such that components that need maintenance and repair can be disassembled quickly, thereby reducing manufacturing and maintenance costs; 4. the operation accuracy and stability of the apparatus is improved; and 5. an influence of a heat convection on the stability of the weighing signals in the open furnace body is reduced.

It should be noted that different embodiments may have different beneficial effects. In different embodiments, possible beneficial effects may be any of the above effects, or any combination thereof, or any other beneficial effects that may be obtained.

The basic concepts have been described above. Obviously, for those skilled in the art, the detailed disclosure is merely by way of example, and does not constitute a limitation on the present disclosure. Although not explicitly stated here, those skilled in the art may make various modifications, improvements, and amendments to the present disclosure. These alterations, improvements, and modifications are intended to be suggested by this disclosure, and are within the spirit and scope of the exemplary embodiments of this disclosure.

Moreover, certain terminology has been used to describe embodiments of the present disclosure. For example, the terms "one embodiment," "an embodiment," and/or "some embodiments" mean that a particular feature, structure or characteristic described in connection with the embodiment is included in at least one embodiment of the present disclosure. Therefore, it is emphasized and should be appreciated that two or more references to "an embodiment," "one embodiment," or "an alternative embodiment" in various portions of this specification are not necessarily all referring to the same embodiment. In addition, certain features, structures, or characteristics in one or more embodiments of the present disclosure may be appropriately combined.

In addition, those skilled in the art may understand that aspects of the present disclosure may be illustrated and described through a number of patentable categories or situations, including any new and useful process, machine, product or substance combination, or any new and useful improvements to them. Accordingly, all aspects of the present disclosure may be performed entirely by hardware, may be performed entirely by software (including firmware, resident software, microcode, etc.), or may be performed by a combination of hardware and software. The above hardware or software can be referred to as "data block", "module", "engine", "unit", "component" or "system". In addition, aspects of the present disclosure may manifest as a computer product located on one or more computer-readable media, the product including computer-readable program code.

Computer storage media may contain a transmitted data signal containing a computer program code, such as on baseband or as part of a carrier wave. The transmitted signal may have multiple manifestations, including electromagnetic form, optical form, etc., or a suitable combination form. A computer storage medium may be any computer-readable medium other than a computer-readable storage medium, which may be connected to an instruction execution system, an apparatus or device to enable communication, propagation, or transmission of a program for use. Program code on a computer storage medium may be transmitted through any suitable medium, including radio, cable, fiber optic cable, RF, or similar medium, or any combination thereof.

Computer program code for carrying out operations for aspects of the present disclosure may be written in any combination of one or more programming languages, including an object oriented programming language such as Java, Scala, Smalltalk, Eiffel, JADE, Emerald, C++, C#, VB.NET, Python or the like, conventional procedural programming languages, such as the "C" programming language, Visual Basic, Fortran 2003, Perl, COBOL 2002, PHP, ABAP, dynamic programming languages such as Python, Ruby and Groovy, or other programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (e.g., through the Internet using an Internet Service Provider) or in a cloud computing environment or offered as a service such as a Software as a Service (SaaS).

Furthermore, the recited order of processing elements or sequences, or the use of numbers, letters, or other designations therefore, is not intended to limit the claimed processes and methods to any order except as may be specified in the claims. Although the above disclosure discusses through various examples what is currently considered to be a variety of useful embodiments of the disclosure, it is to be understood that such detail is solely for that purpose, and that the appended claims are not limited to the disclosed embodiments, but, on the contrary, are intended to cover modifications and equivalent arrangements that are within the spirit and scope of the disclosed embodiments. For example, although the implementation of various components described above may be embodied in a hardware device, it may also be implemented as a software only solution, e.g., an installing on an existing server or mobile device.

Similarly, it should be appreciated that in the foregoing description of embodiments of the present disclosure, various features are sometimes grouped together in a single embodiment, figure, or description thereof for the purpose of streamlining the disclosure aiding in the understanding of one or more of the various embodiments. However, this disclosure method does not mean that the present disclosure object requires more features than the features mentioned in the claims. Rather, claimed subject matter may lie in less than all features of a single foregoing disclosed embodiment.

In some embodiments, numbers expressing quantities of ingredients, properties, and so forth, used to describe and claim certain embodiments of the application are to be understood as being modified in some instances by the term "about," "approximate," or "substantially". Unless otherwise stated, "about," "approximate," or "substantially" may indicate ±20% variation of the value it describes. Accordingly, in some embodiments, the numerical parameters set forth in the description and attached claims are approximations that may vary depending upon the desired properties sought to be obtained by a particular embodiment. In some embodiments, the numerical parameters should be construed in light of a count of reported significant digits and by applying ordinary rounding techniques. Notwithstanding that the numerical ranges and parameters configured to illustrate the broad scope of some embodiments of the present disclosure are approximations, the numerical values in specific examples may be as accurate as possible within a practical scope.

Each patent, patent application, patent application publication and other materials cited herein, such as articles, books, instructions, publications, documents, etc., are hereby incorporated by reference in their entirety. In addition to the application history documents that are inconsistent or conflicting with the contents of the present disclosure, the documents that may limit the widest range of the claim of the present disclosure (currently or later attached to this application) are excluded from the present disclosure. It should be noted that if the description, definition, and/or terms used in the appended application of the present disclosure is inconsistent or conflicting with the content described in the present disclosure, the use of the description, definition and/or terms of the present disclosure shall prevail.

At last, it should be understood that the embodiments described in the present disclosure are merely illustrative of the principles of the embodiments of the present disclosure. Other modifications may be within the scope of the present disclosure. Accordingly, by way of example, and not limitation, alternative configurations of embodiments of the present disclosure may be considered to be consistent with the teachings of the present disclosure. Accordingly, embodiments of the present disclosure are not limited to the embodiments that are expressly introduced and described herein.

What is claimed is:

1. A temperature field device for crystal growth, comprising:
    a first drum;
    a second drum located inside the first drum;
    a bottom plate mounted on a bottom of the temperature field device and covering a bottom end of the first drum;

a first cover plate mounted on a top of the temperature filed device and covering a top end of the first drum, wherein the first cover plate includes a first through hole and a second through hole configured for gas passing; and a second cover plate mounted inside the first drum and covering a top end of the second drum, wherein the second cover plate includes a third through hole corresponding to the first through hole and a fourth through hole corresponding to the second through hole, the third through hole and the first through hole having a same rotation central axis, and the fourth through hole and the second through hole having a same rotation central axis.

2. The temperature field device of claim 1, wherein a height of the second drum is smaller than a height of the first drum.

3. The temperature field device of claim 1, wherein a thickness of the first drum is 1-15 mm.

4. The temperature field device of claim 1, wherein a height of the first drum is 600-1600 mm.

5. The temperature field device of claim 1, wherein a thickness of the second drum is 8-30 mm.

6. The temperature field device of claim 1, wherein a height of the second drum is 500-1500 mm.

7. The temperature field device of claim 1, wherein the temperature field device further includes a filler filled in a space between the first drum and the second drum.

8. The temperature field device of claim 7, wherein a particle size of the filler is 5-200 mesh.

9. The temperature field device of claim 1, wherein the temperature field device further includes a filler filled in the second drum.

10. The temperature field device of claim 9, wherein a filling height of the filler is adjusted to make that a vertical distance between an upper edge of a crucible located in the second drum and an upper edge of a heater located outside the temperature field device is within 0~∓50 mm.

11. The temperature field device of claim 1, wherein a level requirement of the bottom plate is less than 0.5 mm/m, wherein the level requirement of the bottom plate refers to a height difference between two ends of the bottom plate per unit length.

12. The temperature field device of claim 1, wherein
the first through hole configured to allow a gas to enter into the temperature field device; and
the second through hole configured to allow the gas to exit from the temperature field device.

13. The temperature field device of claim 12, wherein a diameter of the first through hole or a diameter of the second through hole is within 15-30 mm.

14. The temperature field device of claim 12, wherein a distance between the first through hole and the second through hole is within 70-150 mm.

15. The temperature field device of claim 12, wherein a rotation central axis of the first through hole or the second through hole is perpendicular to a horizontal plane or forms an angle of 3-20 degrees with a vertical line of the horizontal plane.

16. The temperature field device of claim 12, wherein an observation unit is mounted above the first through hole or the second through hole, the observation unit including:
a chamber connected with the first through hole or the second through hole;
a through hole connected with the chamber, the through hole being configured to allow the gas to enter into or to exit from the temperature field device; and
an observation window mounted on a top of the chamber.

17. The temperature field device of claim 1, wherein a concentricity among the first drum, the second drum, the bottom plate, and the first cover plate is less than 1 mm.

18. The temperature field device of claim 1, wherein a perpendicularity among the first drum, the second drum, the bottom plate, and the first cover plate is less than 0.2°.

* * * * *